US012265237B2

(12) United States Patent
Wu

(10) Patent No.: US 12,265,237 B2
(45) Date of Patent: Apr. 1, 2025

(54) METAL CHALCOGENIDE NANODOME-GRAPHENE PLASMONIC SUBSTRATES

(71) Applicant: University of Kansas, Lawrence, KS (US)

(72) Inventor: Judy Z. Wu, Lawrence, KS (US)

(73) Assignee: University of Kansas, Lawrence, KS (US)

( * ) Notice: Subject to any disclaimer, the term of this patent is extended or adjusted under 35 U.S.C. 154(b) by 975 days.

(21) Appl. No.: 17/289,386

(22) PCT Filed: Oct. 30, 2019

(86) PCT No.: PCT/US2019/058736
§ 371 (c)(1),
(2) Date: Apr. 28, 2021

(87) PCT Pub. No.: WO2020/123049
PCT Pub. Date: Jun. 18, 2020

(65) Prior Publication Data
US 2021/0396916 A1   Dec. 23, 2021

Related U.S. Application Data

(60) Provisional application No. 62/892,244, filed on Aug. 27, 2019, provisional application No. 62/753,223, filed on Oct. 31, 2018.

(51) Int. Cl.
*G02B 5/00* (2006.01)
*H01L 31/0232* (2014.01)
(Continued)

(52) U.S. Cl.
CPC ........ *G02B 5/008* (2013.01); *H01L 31/02327* (2013.01); *H01L 31/032* (2013.01);
(Continued)

(58) Field of Classification Search
CPC . G02B 5/008; H01L 31/02327; H01L 31/032; H01L 31/035218; H01L 31/0384; H01L 31/18
See application file for complete search history.

(56) References Cited

U.S. PATENT DOCUMENTS

2015/0122320 A1   5/2015 Wu et al.
2017/0178905 A1* 6/2017 Delabie ............. H01L 21/02658
2021/0372933 A1* 12/2021 Xie ......................... G16H 40/63

FOREIGN PATENT DOCUMENTS

CN         209981235        1/2020
WO    WO-2017163250 A1 *  9/2017
WO    WO 2020/010233 A1   1/2020

OTHER PUBLICATIONS

The International Search Report and the Written Opinion issued on Jun. 11, 2020 for International Patent Application No. US19/58736; pp. 1-10.
(Continued)

*Primary Examiner* — Lex H Malsawma
(74) *Attorney, Agent, or Firm* — Bell & Manning, LLC

(57) ABSTRACT

Plasmonic substrates are provided which may be used in a variety of optoelectronic devices, e.g., biosensors and photodetectors. The plasmonic substrate may comprise a layer of graphene and a plurality of discrete, individual transition metal chalcogenide nanodomes distributed on a surface of the layer of graphene, each nanodome surrounded by bare graphene. Methods for making and using the plasmonic substrates are also provided.

14 Claims, 10 Drawing Sheets

(51) Int. Cl.
*H01L 31/032* (2006.01)
*H01L 31/0352* (2006.01)
*H01L 31/0384* (2006.01)
*H01L 31/18* (2006.01)

(52) U.S. Cl.
CPC .. *H01L 31/035218* (2013.01); *H01L 31/0384* (2013.01); *H01L 31/18* (2013.01)

(56) References Cited

OTHER PUBLICATIONS

Hsiang-An Chen et al., "Measurement of Interlayer Screening Length of Layered Graphene by Plasmonic Nanostructure Resonances," *The Journal of Physical Chemistry*, 2013, vol. 117; pp. 22211-22217.

Samar Ali Ghopry et al., "Au Nanoparticle/WS2 Nanodome/Graphene van der Waals Heterostructure Substrates for Surface-Enhanced Raman Spectroscopy," *ACS Appl. Nano Mater.*, 2020, vol. 3; pp. 2354-2363.

Samar A. Ghopry et al., "Extraordinary Sensitivity of Surface-Enhanced Raman Spectroscopy of Molecules on MoS2 (WS2) Nanodomes/Graphene van der Waals Heterostructure Substrates," *Adv. Optical Mater.*, 2019, vol. 7; 1801249 (1 of 11).

Hengwei Qiu et al., "Hierarchical MoS2-microspheres decorated with 3D AuNPs arrays for high-efficiency SERS sensing," *Sensors and Actuators B*, (2018), vol. 255; pp. 1407-1414.

Shuwen Zeng et al., "Graphene-MoS2 hybrid nanostructures enhanced surface plasmon resonance biosensors," *Sensors and Actuators B*, (2015), vol. 207; pp. 801-810.

Hao Zhang et al., "Formation of the AuNPs/GO@MoS2/AuNPs nanostructures for the SERS application," *Sensors & Actuators: B. Chemical*, (2019), vol. 282; pp. 809-817.

Gong et al, "Broadband Photodetectors Enabled by Localized Surface Plasmonic Resonance in Doped Iron Pyrite Nanocrystals," *Advanced Optical Materials*, 2018, vol. 6; pp. 1701241 (1 of 11).

Liu et al, "Printable Transfer-Free and Wafer-Size MoS2/Graphene van der Waals Heterostructures for High-Performance Photodetection," *ACS Appl. Mater. Interfaces*, 2017, vol. 9, No. 14; pp. 12728-12733.

Lu et al, "High sensitivity surface enhanced Raman spectroscopy of R6G on in situ fabricated Au nanoparticle/graphene plasmonic substrates," *Carbon*, vol. 86, May 2015; pp. 78-85.

Goul et al, Quantitative analysis of surface enhanced Raman spectroscopy of Rhodamine 6G using a composite graphene and plasmonic Au nanoparticle substrate, *Carbon*, vol. 111, Jan. 2017; pp. 386-392.

* cited by examiner

METAL CHALCOGENIDE NANODOME-GRAPHENE PLASMONIC SUBSTRATES

CROSS-REFERENCE TO RELATED APPLICATIONS

This application is a National Stage of International Application No. PCT/US19/58736, filed Oct. 30, 2019, which claims the benefit of U.S. Patent Application No. 62/892,244, filed Aug. 27, 2019 and of U.S. Patent Application No. 62/753,223, filed Oct. 31, 2018, the contents of each which are herein incorporated by reference.

REFERENCE TO GOVERNMENT RIGHTS

This invention was made with government support under ARO-W911NF-16-1-0029 awarded by the US Army Research Office and under 1508494, 1909292 and 1809293 awarded by the National Science Foundation. The government has certain rights in the invention.

BACKGROUND

Surface enhanced Raman spectroscopy (SERS) can improve the Raman signature of molecules and offers a promising approach for high sensitivity biosensing that enables detection of a single molecule. SERS is a result of two mechanisms: electromagnetic enhancement (EM) and chemical enhancement (CM). EM involves the local electromagnetic field enhancement that is typically attributed to the localized surface plasmonic resonance (LSPR) of free charge carriers at the surface of metal nanostructures induced by the incident light. The LSPR wavelength is determined primarily by the free charge carrier concentration of the metal with a minor effect from the dimension and shape of the metal nanostructures. Molecules positioned close to the LSPR nanostructures experience an enhanced evanescent electromagnetic field as compared to the incident excitation. The EM enhancement directly depends on the morphology, dimension, and electrical conductivity of the metal surface, the wavelength of the incident light, and the dielectric constant of the surrounding medium of the metal. The EM enhancement factor can reach over $10^8$, enabling ultrasensitive SERS detection down to the single-molecule level.

CM is induced by charge-transfer between the SERS substrate and the molecule with an enhancement factor typically on the order of $10^1$ to $10^3$. The CM effect is dictated by the electronic structure at the interface formed between the analyte and substrate. The effect can be optimized by selecting a substrate with a favorable band alignment with the highest-occupied molecular orbital (HOMO) and the lowest-unoccupied molecular orbital (LUMO) at the analyte-substrate interface. Thus, tuning of the substrate electronic structure is important to achieving an enhanced CM effect.

There has been intensive research exploring graphene-based SERS substrates in view of graphene's unique two dimensional (2D) atomically flat surface with delocalized $\pi$ bonds, chemical inertness, biological compatibility, superior electronic and photonic properties, and the intrinsic Fermi energy at ~4.5 eV that is compatible, as well as tunable, for CM enhancement with a large number of probe molecules. The enhancement factor is quantitatively affected by the alignment of the probe molecule's electronic structure with the Fermi level of graphene.

Metal nanostructures have been used with graphene to form SERS substrates. Since the optical absorption of graphene is ~2.3% and the intrinsic graphene plasmon is in the THz frequency region, graphene does not provide an EM contribution in the visible spectrum at which most SERS characterization of molecules is carried out. Instead, the use of metal nanostructures provides a CM enhancement such that metal/graphene nanohybrids have a higher SERS enhancement factor than each alone. However, the metal/graphene nanohybrids have several disadvantages, including the strong spectra noise background introduced by the metal due to the carbonization effect on the metal surface, the metal-catalyzed side reactions of the probe molecules, and the deformation and distortion of the probe molecules due to the strong metal-adsorbate interactions.

SUMMARY

Plasmonic substrates are provided which may be used in a variety of optoelectronic devices, e.g., biosensors and photodetectors. In embodiments, the plasmonic substrate comprises a layer of graphene and a plurality of discrete, individual transition metal chalcogenide nanodomes distributed on a surface of the layer of graphene, each nanodome surrounded by bare graphene.

Methods of forming the plasmonic substrates are also provided. In embodiments, a method of forming the plasmonic substrate described above comprises applying a solution comprising a transition metal precursor to the surface of the layer of graphene to form a coating thereon, and annealing the coating in the presence of a chalcogen to induce self-assembly of the nanodomes from the coating.

Methods of using the plasmonic substrates are also provided. In embodiments, a method of using the plasmonic substrate described above comprises illuminating the substrate with electromagnetic radiation to excite surface plasmons at the nanodome-graphene interfaces.

Other principal features and advantages of the disclosure will become apparent to those skilled in the art upon review of the following drawings, the detailed description, and the appended claims.

BRIEF DESCRIPTION OF THE DRAWINGS

Illustrative embodiments of the disclosure will hereafter be described with reference to the accompanying drawings.

DETAILED DESCRIPTION

Figure 1A:
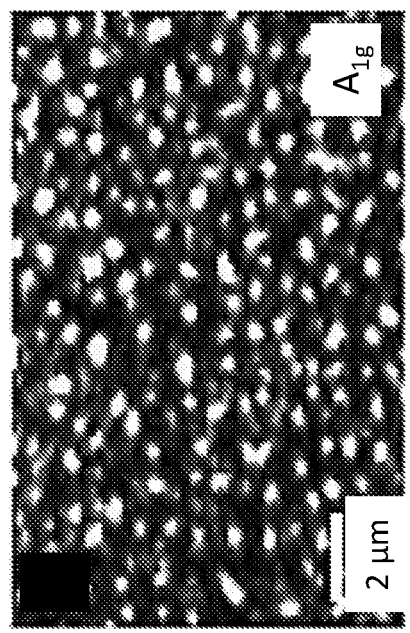
FIG. 1A shows a 15×12 μm$^2$ Raman map of MoS$_2$ using its $A_{1g}$ mode taken from the MoS$_2$/graphene van der Waals (vdW) heterostructure. An expanded portion of the map is shown on the right, with a single MoS$_2$ nanodome (ND) outlined with a circle. The excitation wavelength of 488 nm was used.
Figure 1A:
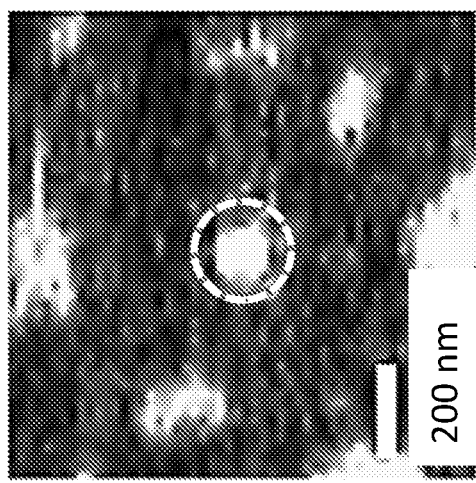

Provided are plasmonic substrates and related methods.

The plasmonic substrates comprise a layer of graphene and a plurality of transition metal-containing nanodomes distributed on the surface of the layer of graphene. By "plasmonic substrate" it is meant that the plasmonic substrate is capable of coupling with electromagnetic radiation to excite surface plasmons. The electromagnetic radiation to be coupled may include radiation in the visible portion of the electromagnetic spectrum (e.g., light having wavelengths from 400 nm to 700 nm), radiation in the ultraviolet portion of the electromagnetic spectrum (e.g., light having wavelengths from 150 nm to 400 nm), etc.

The layer of graphene may be a single-layer (i.e., a monolayer) or multilayer. In embodiments, however, the layer of graphene may include multiple sublayers of graphene, each sublayer corresponding to a monolayer of graphene. The lateral dimensions of the layer of graphene are not particularly limited. The graphene may be of high quality as evidenced by characteristic graphene bands as measured using Raman spectroscopy. Specifically, the intensity of the G, D, and 2D bands provides a measure of the quality of the graphene. An intensity ratio of 2D to G of about 2 and a negligible D peak (associated with amorphous carbon and other defects) are characteristic of a high-quality single-layer of graphene (see the Examples, below). The layer of graphene is flat and planar. This is by contrast to structured surfaces having features which extend or project away an underlying region of the surface, e.g., a silicon surface which has been patterned to provide silicon nanostructures thereon.

Although various techniques are known for producing graphene, it has been found that the technique used affects the quality of the surface of the graphene (including its morphology, presence of defects, presence of impurity elements/molecules). The quality of the surface, in turn, affects the ability to form the plurality of transition-metal containing nanodomes on that surface and thus, the ability to form the plasmonic substrate. As such, the layer of graphene may be produced using the techniques described in the Example below. The layer of graphene may be a "transferred" layer of graphene, which refers to a layer of graphene which has been transferred from a growth substrate on which it was grown. The layer of graphene may be a "chemical vapor deposition (CVD)-synthesized" layer of graphene, which refers to a layer of graphene which has been grown using CVD. Finally, the layer of graphene may be an "impurity-free" layer of graphene, which refers to a layer of graphene having an amount of foreign elements/molecules which is zero or too small to affect the structure/properties of graphene. Graphene may be subjected to a cleaning procedure to reduce/eliminate foreign elements/molecules on its surface. Transfer techniques, CVD techniques, and cleaning procedures which may be used are described in the Examples, below. However, it is noted that a high-quality layer of graphene does not necessarily have to be a transferred layer of graphene. The layer of graphene may be both a transferred or transfer-free CVD-synthesized layer of graphene such as those produced according to Liu et al., Carbon 96 (2016) 203-211 and Liu et al., ACS Appl. Mater. Interfaces 2017, 9, 12728-12733, each of which is hereby incorporated by reference in its entirety.

The plurality of transition metal-containing nanodomes distributed on the surface of the layer of graphene refers to discrete, individual nanodomes which are separated and isolated from one another by regions of bare (i.e., uncoated) graphene. In embodiments, all of the nanodomes are separated and isolated from one another. However, in embodiments, some nanodomes may be connected to each other, e.g., through a bridge of the material of the transition metal-containing nanodomes, but the amount of such connected nanodomes is too small to affect the plasmonic properties of the plasmonic substrate. In embodiments, at least 80%, 85%, 90%, or 95% of the nanodomes are discrete, individual nanodomes surrounded by bare graphene. In embodiments, the average nanodome-to-nanodome spacing (corresponding to dimension of bare region of graphene surrounding individual nanodomes) is at least 5 nm, 10 nm, at least 50 nm, at least 100 nm, at least 200 nm, or in the range of from 1 nm to 300 nm. Confirmation of the separation and isolation of nanodomes as well as the determination of the average nanodome-to-nanodome spacing may be obtained using Raman spectroscopy and microscopy and atomic force microscopy (AFM) (see Examples below).

The transition metal-containing nanodomes may be characterized by their shape, dimensions and distribution across the surface of the layer of graphene. The shape of the nanodomes may refer to both the shape of the outline/perimeter of the nanodome at the interface formed between the nanodome and the surface of the layer of graphene and the shape of the cross-section of the nanodome perpendicular to the layer of graphene. Regarding the interfacial outline/perimeter, the shape may be circular, but this term encompasses similar shapes such as ellipses, ovoids as well as shapes that may have some straight edges such as squares, hexagons, etc. The nanodomes may be characterized by a diameter or width taken as the maximum distance across the outline/perimeter. This dimension may be determined from AFM images such as those shown in FIG. 1B and FIG. 7B. This dimension may be reported as an average dimension by which it is meant an average value from a representative number of nanodomes in the plurality of nanodomes. However, the average diameter/width is in the nanoscale range, i.e., less than 1000 nm. In embodiments, the average diameter/width is less than 700 nm, less than 500 nm, less than 400 nm, less than 100 nm, less than 50 nm. This includes embodiments in which the average diameter/width is in the range of from 50 nm to 700 nm, from 100 nm to 500 nm, from 100 nm to 300 nm, from 1 nm to 300 nm, from 50 nm to 500 nm, from 50 nm to 100 nm.

Regarding the cross-sectional shape, the shape is dome-like, but this term encompasses similar shapes such as triangles, pyramids, hemispheres, disks, etc. The nanodomes may be characterized by a thickness taken as the maximum distance from the interface with the layer of graphene to the top of the nanodome, perpendicular to the interface. This dimension may be determined from AFM images and may refer to an average value as described above. Again, the average thickness is nanoscale. It is also generally less than the diameter/width of the nanodome. In embodiments, the average thickness is that which corresponds to several or a few layers (e.g., 10 or less, 9, 8, 7, 6, 5, 4, 3, 2) of the transition-metal compound from which the nanodome is formed. In embodiments, the average thickness is less than 20 nm, less than 15 nm, less than 10 nm, less than 5 nm, in the range of from 0.5 nm to 20 nm, in the range of from 0.5 nm to 10 nm.

The transition metal-containing nanodomes may be further characterized by the distribution of nanodomes across the surface of the layer of graphene. In embodiments, the distribution is uniform, by which it is meant that the nanodomes are separated from each other by substantially equal amounts. (See FIGS. 1A and 7A.)

The transition-metal containing nanodomes comprise a transition metal. However, the transition metal is not in its elemental form, but rather, is in the form of a chemical compound. As such, the term "metal-free" may be used in reference to the present transition-metal containing nanodomes. Although the nanodomes do contain transition metal, that metal is not in its elemental form. In embodiments, the transition metal compound is a transition metal chalcogenide. In embodiments, the transition metal compound is a transition metal dichalcogenide (TMD). In embodiments, the transition metal compound has formula $MX_2$, wherein M is a transition metal and X is a chalcogen. In embodiments, M is selected from Mo, W, Bb, Ta, Ti and Re. In embodiments, X is selected from S, Se and Te. As further described below, for TMD nanodomes, a large electric conductivity in the TMD nanodomes may be induced via optical excitation of electrons from the HOMO to the LUMO and the presence of graphene facilitates this charge transfer. In addition, the nanodome morphology allows for localized surface plasmon resonances.

In the plurality of transition-metal containing nanodomes, nanodomes in the plurality may have the same composition. Individual nanodomes may be formed of the same transition metal compound. In other embodiments, nanodomes in the plurality may have different compositions, e.g., nanodomes of $WS_2$ and nanodomes of $MoS_2$.

As with the technique used to form the layer of graphene, the inventors have also found that the technique used to form the plurality of transition-metal containing nanodomes also affects whether such nanodomes are formed and thus, the ability to form the plasmonic substrate. Appropriate illustrative methods are further described below and in the Example.

The plasmonic substrate may further include a supporting substrate underlying the layer of graphene. Various supporting substrates may be used, e.g., silicon, quartz, etc.

The plasmonic substrates may be characterized by their optical properties, e.g., their Surface-Enhanced Raman Spectroscopy (SERS) sensitivity. The SERS sensitivity may refer to a specific molecule and a specific wavelength of light, which may be a wavelength of light which is resonant or non-resonant with a particular transition within the molecule. By way of illustration, SERS sensitivity may be measured using rhodamine 6G at a wavelength of 532 nm (resonant) or at 633 nm (non-resonant). The SERS sensitivity may be measured as described in the Example below. In embodiments, the plasmonic substrate is characterized by a SERS sensitivity of at least $10^{-6}$ M, $10^{-8}$ M, $10^{-10}$ M, at least $10^{-11}$ M, or at least $10^{-12}$ M. The plasmonic substrate is characterized by a SERS sensitivity which is greater than that of the underlying layer of graphene and greater than that of a comparative substrate comprising a layer (i.e., a flat, planar layer) of the transition metal compound from which the nanodomes are formed. In the comparative substrate with the layer of the transition metal compound, the thickness of the layer may be the same as the average thickness of the nanodomes, e.g., within 20% or 10% of the thickness. In embodiments, the plasmonic substrate has a SERS sensitivity which is at least 5 times, 10 times, at least $10^2$ times, at least $10^3$ times greater, at least $10^4$ times greater, or at least $10^5$ times greater than that of the underlying layer of graphene and such a comparative substrate. These factors may be referred to as SERS enhancement factors.

Figure 8A:
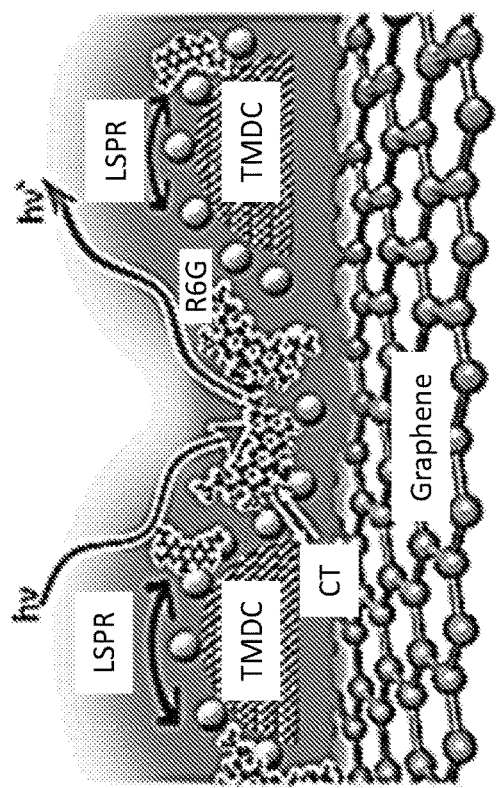
FIG. 8A shows a schematic illustration of SERS enhancement on AuNPs/$WS_2$-NDs/graphene substrate.

As illustrated in FIG. 8A and further described in Example 3, the plasmonic substrates may further comprise metal nanoparticles (e.g., Au, Ag, Cu, etc.) on a surface thereof. These metal nanoparticles are generally smaller than the transition-metal containing nanodomes and may have average diameters in a range of from 10 nm to 50 nm, from 10 nm to 40 nm, from 10 nm to 15 nm. The metal nanoparticles may be distributed, e.g., uniformly. on both the transition-metal containing nanodomes as well as bare graphene between the nanodomes. The metal nanoparticles are generally in direct contact with the nanodomes/graphene so as to form additional interfaces with those surfaces.

Methods for making the present plasmonic substrates are also provided. In embodiments, such a method comprises applying a transition metal precursor to a surface of a layer of graphene to form a coating thereon, and annealing the coating under conditions to convert the coating to a plurality of transition metal-containing nanodomes distributed on the surface of the layer of graphene. The layer of graphene may be transferred or transfer-free, CVD-synthesized and/or impurity-free as described above. The transition metal precursor is a chemical compound which provides a source of the transition metal to be included in the nanodome. Transition metal salts are suitable precursors. The transition metal precursor may be applied to the surface of the layer of graphene using various thin film deposition techniques such as dip coating, spin coating, spray coating, etc. As further described in the Example below, it has been found that the thickness of the coating of the transition metal precursor affects the ability to form the plurality of nanodomes therefrom, and thus, the plasmonic substrate. In embodiments, the thickness of the coating is no more than 10 nm, no more than 7 nm, no more than 5 nm, no more than 3 nm, or in the range of from 1 nm to 10 nm. Thin coatings can be achieved, e.g., through dip coating followed by spinning, by minimizing the number of dips into a solution of the transition metal precursor. In embodiments, a single dip is used. In embodiments, no more than two dips are used.

The annealing step may take place in the presence of a chalcogen, i.e., the chalcogen to be included in the nanodome. This may be accomplished by exposing the coating of the transition metal precursor to a chalcogen-containing gas during the annealing. This gas may include other gases, e.g., $H_2$ and Ar. Various elevated temperatures (e.g., 450° C.) and periods of time (e.g., 30 minutes) may be used during the annealing step.

Illustrative transition metal precursors, chalcogen-containing gas, elevated temperatures and periods of time are provided in the Example below. These parameters, as well as the coating technique, may be adjusted to achieve a uniform distribution of discrete, individual nanodomes as well as a desired, e.g., maximum SERS sensitivity/enhancement factor.

The present methods of making the plasmonic substrates are in situ methods in which the transition-metal containing nanodomes having the desired composition, size, and morphology self-assemble from the applied coating on the underlying graphene during the annealing step. This is by contrast to methods in which nanostructures of a desired composition, size, and morphology are formed separately and subsequently deposited onto a substrate.

The plasmonic substrates may be used in a variety of optoelectronics, e.g., photodetectors (see Example 2) and sensing applications. Methods for using the plasmonic substrates are also provided. In an embodiment, a method comprises illuminating any of the disclosed plasmonic substrates with electromagnetic radiation to excite surface plasmons at the nanodome-graphene interfaces. The method may further comprise detecting scattered light from the plasmonic substrates. Such a method is the basis for using the present plasmonic substrates as a sensor, e.g., to detect a variety of chemical or biological compounds via SERS.

EXAMPLES

Example 1

This Example reports the first successful fabrication of $MoS_2$ (and $WS_2$) nanodomes on graphene. The TMD nanodomes/graphene vdW heterostructures on $SiO_2$/Si wafers were used to investigate the SERS signatures of probe molecules of fluorescent R6G on these substrates. Remarkably high SERS sensitivities in the range of $5\times10^{-11}$ M to $5\times10^{-12}$ M were obtained on these TMD nanodomes/graphene vdW heterostructure SERS substrates. This is not only several orders of magnitude higher than that of single-layer graphene, $MoS_2$, and $WS_2$ SERS substrates, but also comparable to, and slightly better than, the best sensitivity reported on the plasmonic metal nanostructure/graphene SERS substrates. (S. Xu, et al., Sensors and Actuators B: Chemical 2016, 222, 1175; and S. Feng, et al., Sci Adv 2016, 2, e1600322.)

Methods

CVD synthesis and transfer of graphene. Graphene was synthesized using chemical vapor deposition (CVD) on copper foils in a quartz tube inside a CVD furnace. (Q. Liu et al., Carbon 2015, 93, 199.) Briefly, the temperature was increased, followed by purging the substrate using $H_2$ at a flow rate of 40 sccm. After the temperature reached 1050° C., after approximately 25 min of heating, the $H_2$ environment was maintained for 30 min to clean the surface. The CVD graphene growth was carried out at 1050° C. for 30 min with a combination of $H_2$ and $CH_4$ with a flow rate of 7 sccm and 40 sccm, respectively. The typical dimension of the CVD graphene was 1 cm×2 cm. After CVD growth, graphene was transferred to a silicon substrate. (R. Lu et al., Scientific Reports 2016, 6.) Briefly, Poly(methyl methacrylate) (PMMA) was spin-coated on graphene, followed by baking at 120° C. for 5 min. The Cu/graphene/PMMA was then immersed (PMMA side up) in copper etchant $FeCl_3$ for about 3 hours to dissolve the Cu foil. Afterwards, the sample was rinsed/soaked in deionized water multiple times to remove residues of the copper etchant. The graphene/PMMA assemblies were then transferred onto the target $SiO_2$/Si substrates and left to dry overnight. The PMMA layer was removed by immersion in acetone (multiple times) and IPA, and then dried under a flow of $N_2$ gas. Thermal annealing at 400° C. for 30 min in mixed Ar/$H_2$ gases (500 sccm/300 sccm) was applied to remove residues of chemicals and polymers. It was found that the clean, flat, high quality surface of the graphene was important for the formation of the TMD nanodomes (e.g., versus formation of a continuous layer of TMD) and the quality of the TMD nanodome/graphene vdW interface.

Growth of TMD ($MoS_2$ and $WS_2$) nanodomes/graphene heterostructures. A $(NH_4)_2MoS_4$ precursor solution was first prepared by dissolving in N,N-dimethylformamide (DMF) to a concentration of 0.1 wt %. To coat the precursor on the graphene/$SiO_2$/Si samples, they were dipped into the $(NH_4)_2MoS_4$ precursor solution for various numbers of times, followed by sample spinning immediately afterwards at 3000 rpm. A single dip led to a very thin coating of the precursor solution that desirably segregated into nanodomes on the hydrophobic graphene surface upon heating. Samples coated with precursor solution were placed in a quartz tube furnace with a mix of 10 sccm $H_2$ and 50 sccm Ar gas. Sulfur powder was placed in the upstream region of the quartz tube and warmed up by the emission heat of the tube furnace. The samples were annealed at 450° C. for 30 min and cooled down to room temperature. The fabrication process for $WS_2$ nanodomes/graphene vdW heterostructures was very similar to that for the $MoS_2$ nanodomes/graphene vdW heterostructures, except that the ammonium tetrathiotungstate $(NH_4)_2WS_4$ precursor solution was used.

A thin layer of the precursor solution (~ a few nm) and the clean, flat, high quality graphene surface were found to be keys to TMD nanodome formation. On graphene directly grown on Si/$SiO_2$ substrates (i.e., non-transferred graphene), it was found that the TMD formed a continuous layer, likely due to the growth defect induced by the rough surface of graphene. In addition, if the number times the sample was dipped into the precursor solution was increased, e.g., to four times, the morphology of the $MoS_2$ transitioned from discrete nanodomes, to a mixture of discrete and connected nanodomes, to a continuous layer of TMD. Moreover, the single-dipped samples exhibited the best SERS performance while SERS performance drastically decreased with an increasing number of dips into the precursor solution.

Preparation of the R6G solutions. A solution of aqueous R6G was made by dissolving solid concentrated R6G from Sigma Aldrich in deionized water. Droplets of the R6G aqueous solution with different concentrations were placed on the $MoS_2$ nanodomes/graphene/$SiO_2$/Si substrate and dried on a hotplate at 70° C. for 1 hour. Droplets with lower concentration were made by diluting the highest concentration R6G solution.

Simulation. Density Function theory (DFT) was used to calculate the electronic structure of TMD ($MoS_2$, $WS_2$) flake and graphene for a deeper understanding of the SERS sensitivity enhancement in the TMD/graphene vdW heterostructures. To assess the potential charge transfer mechanism between the TMD ($MoS_2$, $WS_2$) flake and graphene, the electron localization function (ELF) was evaluated using the VASP code. ELF provides a quantitative measure of the spatial delocalized bonds within the hybrid structure. Detailed atomic relaxation processes and electronic structure calculations employed can be found elsewhere. (M. Alamri et al., ACS Applied Nano Materials 2019, DOI: 10.1021/acsanm.8b02308.) To account for the dispersion effect, however, the vdW functional was used following the approach of Dion et al. and Roman-Perez et al. and as implemented in VASP. (M. Dion et al., Phys Rev Lett 2004, 92, 246401; and G. Roman-Perez et al., Physical Review Letters 2009, 103, 096102.) To assess the charge transfer mechanism, the Bader Charge Analysis was performed using the fast and efficient algorithm which is being implemented in VASP. In addition, the potential charge transfer mechanism between the TMD flake and graphene was also assessed by means of the ELF plots as evaluated using the VASP code. ELF provides a quantitative and normalized (range of 0-1) measure of the spatial delocalized bonds within the hybrid structures. The library of PAW pseudopotentials was used as provided by VASP with the relatively high energy cut-off of 400 eV with a dense FFT-mesh of 250×250×250 to ensure a high level of accuracy of the electron charge density.

Characterization and Raman measurements. Single droplets of R6G with the concentration in the range of $5\times10^{-5}$ M to $5\times10^{-12}$ M were deposited onto TMD nanodomes/graphene vdW heterostructures and single-layer $WS_2$, $MoS_2$, and graphene on $SiO_2$/Si, as well as bare $SiO_2$/Si substrates. Afterwards, the samples were left to dry on a hotplate at 70° C. for 1 hour and then characterized. Surface morphology and structural properties of the TMD nanodomes/graphene heterostructures were examined with AFM (WiTec alpha 300) and Raman spectroscopy using a confocal Raman system (also WiTec alpha 300) with laser excitation of 532 nm and 633 nm. For SERS measurements, a droplet of R6G aqueous solution with a given concentration was casted onto the surface of single-layer $WS_2$, $MoS_2$, graphene as well as $MoS_2$ ($WS_2$) nanodomes/graphene heterostructures, followed by baking on a hotplate at 70° C. for 1 hour to dry the solvent. The sub-millimeter laser beam spot with a 100× microscope objective was reasonably small, allowing multiple scan locations in the center of each drop during the Raman measurement. A low intensity, typically in the range of 5-10 mW, and small integration time of 3 s were used to avoid damage of the R6G molecules. For better signal to noise ratio, each spectrum presented was the result of an average of several spectra taken on the same sample spot.

Results

Figure 1B:
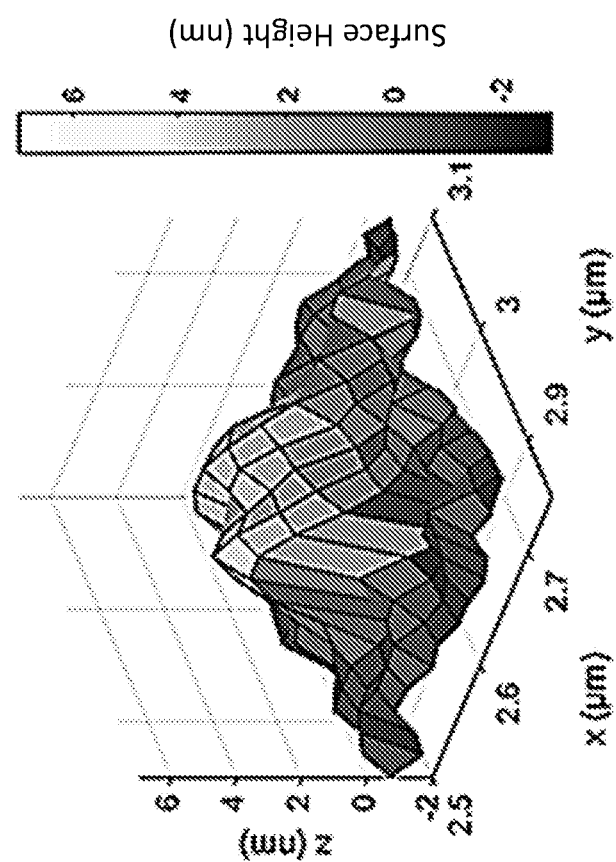
FIG. 1B is plot derived from atomic force microscopy (AFM) images of MoS$_2$ nanodomes, illustrating the dome-like shape of the MoS$_2$ islands.

The Raman spectrum (not shown) of graphene shows three graphene characteristic peaks: G band at ~1580 $cm^{-1}$, small disorder induced D band at ~1350 $cm^{-1}$, and 2D band at ~2702 $cm^{-1}$. The intensity ratio of 2D to G is about 2. This, together with a negligible D peak, shows that the sample is high-quality single-layer graphene. The Raman spectrum (not shown) of $MoS_2$ grown on top of the single-layer graphene was also obtained. Besides the three graphene characteristic peaks, two additional peaks at ~378 $cm^{-1}$ ($E_{1g}^2$) and ~403 $cm^{-1}$ ($A_{1g}$) are ascribed to $MoS_2$. The frequency difference between $A_{1g}$ and $E_{1g}^2$ modes is about 25 $cm^{-1}$, indicating the $MoS_2$ is multilayer (~6 layers) grown on top of the graphene. The intensity ratio of 2D to G is about 1.3, which is lower than the ratio of ~2 observed on graphene before growth of the $MoS_2$ and may be attributed to the interface interaction between the $MoS_2$ and graphene. The intensity ratio of D to G peaks remains negligible, indicating that the graphene degradation is negligible during the $MoS_2$ growth. Raman maps of graphene (G mode) and $MoS_2$ ($A_{1g}$ mode) on graphene using an excitation laser of 488 nm were obtained. The Raman map of $MoS_2$ is shown in FIG. 1A. While graphene shows a more continuous distribution, $MoS_2$-on-graphene has a morphology of uniformly distributed isolated islands. (An expanded image next to FIG. 1A shows a few islands). FIG. 1B is derived from AFM images of a few $MoS_2$ islands on graphene, revealing that each $MoS_2$ island has a nanodome shape with lateral dimension on the order of 200-500 nm and a height in the range of 3-5 nm. This result is consistent with the number of $MoS_2$ layers suggested by the Raman spectra. Similar results were observed for $WS_2$/graphene vdW heterostructures, except the $WS_2$ signature peaks were located at 342 $cm^{-1}$ and 412 $cm^{-1}$ in Raman spectra.

Figure 2:
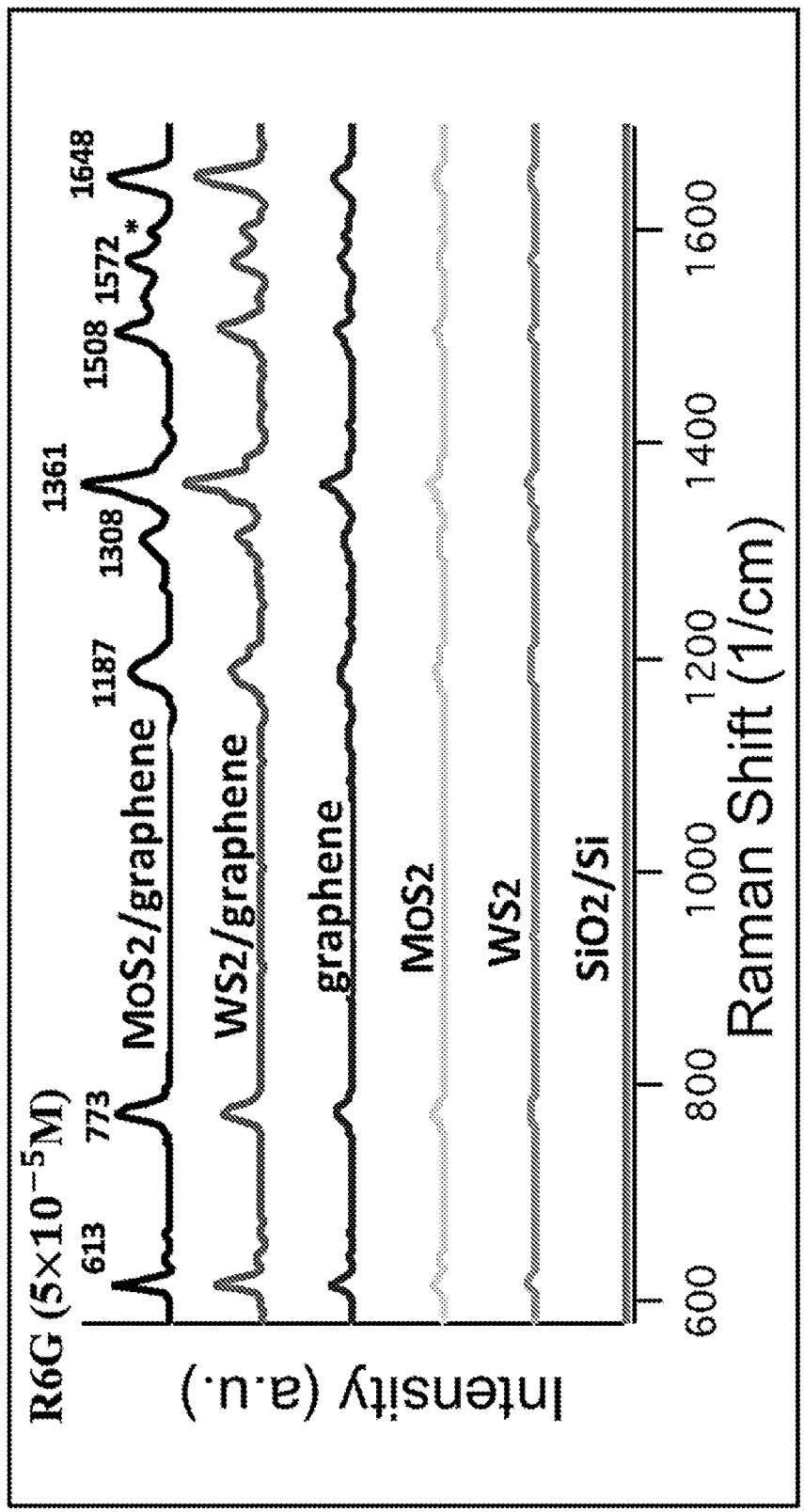
FIG. 2 shows Raman spectra of Rhodamine 6G (R6G) molecules [5×10$^{-5}$ M] deposited on the MoS$_2$/graphene, WS$_2$/graphene heterostructures, MoS$_2$, WS$_2$, graphene and bare SiO$_2$/Si, using an excitation wavelength of 532 nm.

FIG. 2 compares the Raman spectra of R6G ($5\times10^{-5}$ M) on the TMD ($MoS_2$ and $WS_2$) nanodomes/graphene vdW heterostructures, as well as on graphene, $MoS_2$, $WS_2$ monolayers, and bare $SiO_2$/Si. The excitation laser wavelength was 532 nm. The SERS enhancement is shown to depend strongly on the substrates employed. On the bare $SiO_2$/Si substrate, R6G Raman signals are barely visible, which is expected due to the lack of SERS enhancement. Among the three single-layer substrates of graphene, $MoS_2$, and $WS_2$, the Raman R6G signature peaks are the most intense on graphene, which is not surprising considering there is a more efficient charge transfer to the more conductive graphene from R6G molecules. On the other hand, the CM enhancement on TMD is much less than on graphene. In stark contrast, a significant Raman enhancement of the R6G signature was observed for the TMD nanodomes/graphene vdW heterostructures. In fact, the use of $MoS_2$ and $WS_2$ TMDs yields a SERS enhancement that is much higher than (and hence cannot be explained solely by) the combined CM effects from the constituents of TMD and graphene. By comparing the feature peak intensity of R6G at 613 $cm^{-1}$, an enhancement factor of 7-9 was achieved on the $MoS_2$ nanodomes/graphene or $WS_2$ nanodomes/graphene vdW heterostructures as compared to the single-layer $MoS_2$, $WS_2$, or graphene reference substrates at an R6G concentration of $5\times10^{-5}$ M.

Figure 3:
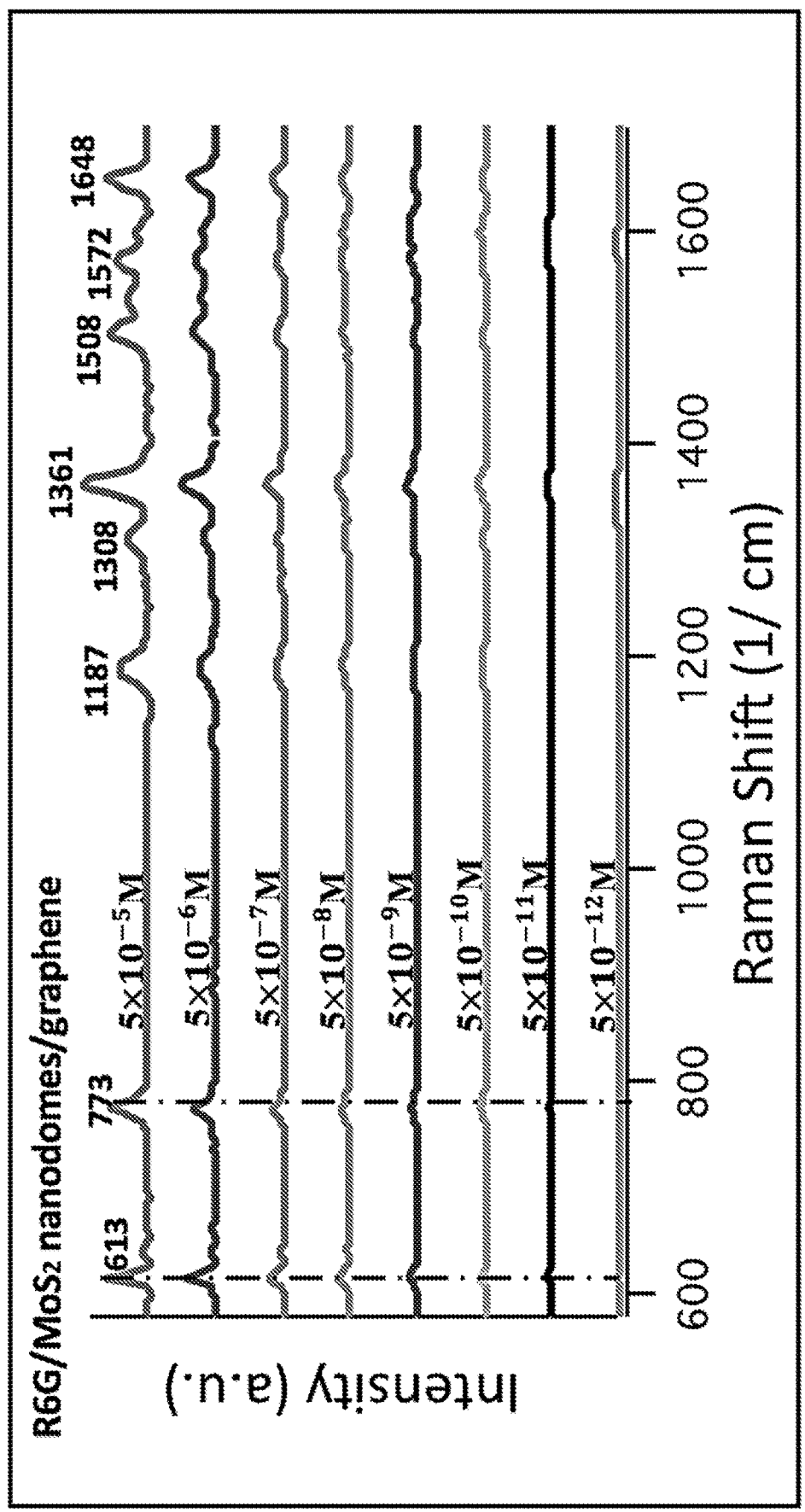
FIG. 3 shows Raman spectra of R6G molecules with different concentrations from 5×10$^{-5}$ M to 5×10$^{-12}$ deposited on MoS$_2$ nanodomes/graphene.

Raman spectra of R6G molecules at different concentrations were collected on both single layer ($MoS_2$, $WS_2$, and graphene) and $MoS_2$ ($WS_2$) nanodomes/graphene vdW heterostructures to demonstrate SERS sensitivity using the 532 nm resonance excitation wavelength for R6G. Some results for $MoS_2$ nanodomes/graphene vdW heterostructures are shown in FIG. 3 (others are not shown). As shown in FIG. 3 (for $MoS_2$), the Raman signatures of R6G on both TMD nanodomes/graphene vdW heterostructures are visible at the lowest R6G concentration of $5\times10^{-12}$ M. This sensitivity is comparable to, and slightly better than, the best so far reported on plasmonic metal nanostructure/graphene SERS substrates. (S. Xu, et al., 2016; and S. Feng, et al., 2016.) The high SERS sensitivity is unique to the TMD nanodomes/graphene vdW heterostructure since the R6G sensitivities of single-layer graphene and TMD substrates are significantly lower (data not shown). In fact, the Raman signatures of R6G on $MoS_2$ and $WS_2$ substrates have a SERS sensitivity of around $5\times10^{-6}$ M R6G. Graphene has a slightly higher SERS sensitivity of $5\times10^{-7}$ M R6G.

It is believed that the nanodome morphology of the $MoS_2$ layer is critical to the high SERS sensitivity. As detailed in the Methods section, the morphology of $MoS_2$-on-graphene evolves from discrete nanodomes (single dipping) to a continuous layer of $MoS_2$ at four such dippings. The variation in the morphology of the $MoS_2$ layer led to a drastic decrease of the SERS sensitivity with increasing number of dips. The $MoS_2$/graphene prepared using two dips has a similar Raman map to the single dip sample (data not shown). However, at two dips, some nanodomes are connected by bridges of $MoS_2$, leading to a more nonuniform morphology. This is consistent with the reduced SERS sensitivity at $\sim5\times10^{-11}$ M. Raman maps of the $MoS_2$ $A_{1g}$ mode of $MoS_2$/graphene samples prepared using three and four dips, respectively, were obtained (not shown). Patches of continuous $MoS_2$ with only a small number of discrete nanodomes were obtained. R6G Raman signatures taken on the three-dip sample were compared (not shown), showing that the sensitivity of $5\times10^{-8}$ M is four orders of magnitude less than that on the single-dip $MoS_2$ nanodomes/graphene vdW heterostructure (FIG. 3). Raman spectra of R6G ($5\times10^{-8}$ M) on $MoS_2$/graphene vdW heterostructures prepared using one, two, three and four dippings were compared (not shown). By comparing the feature peak intensity of R6G at 613 $cm^{-1}$, it is clear that an enhancement factor of up to 13 can be achieved for the single-dip sample.

The Raman spectra of R6G molecules at different concentrations were also collected on the TMD nanodomes/graphene vdW heterostructures using non-resonance excitation (not shown). Raman spectra of R6G at different concentrations from a $WS_2$ nanodomes/graphene vdW heterostructure substrate using the excitation wavelength of 633 nm were obtained (not shown). Most of the R6G Raman signatures are visible at $5\times10^{-7}$ M R6G concentration while the detectable signature modes at the lowest R6G concentration of $5\times10^{-10}$ M are limited to the vibrational modes with larger polarizability, such as 613 and 1320 $cm^{-1}$. This indicates that the SERS sensitivity is about one to two orders of magnitude lower when using the non-resonance 633 nm excitation as compared to the resonance 532 nm excitation. However, this remarkable non-resonance sensitivity of $5\times10^{-10}$ M for R6G probe molecules is almost three orders of magnitude higher than that reported on plasmonic Au nanoparticle/graphene SERS substrates. (R. Goul et al., Carbon 2017, 111, 386.) In order to study the SERS performance on the substrates, the Raman peak of R6G at 613 $cm^{-1}$ on single layer substrates and at 613 $cm^{-1}$ and 773 $cm^{-1}$ on the TMD ($MoS_2$ and $WS_2$) nanodomes/graphene vdW heterostructure substrates were used to fit the Raman signatures as a function of the R6G concentration. An approximately logarithmic relation was observed on all substrates (not shown).

The observed extraordinary SERS enhancement in the TMD nanodomes/graphene vdW heterostructures is related to the role that the TMD nanodomes play in the plasmonic substrates. To shed some light on this, especially on the correlation between the microscopic dipole moments and dipole-dipole interactions and the SERS sensitivity enhancement in the TMD ($MoS_2$, $WS_2$) nanodomes/graphene vdW heterostructures, the electronic structure of this heterostructure was calculated using DFT. The final configuration of TMDs ($MoS_2$ and $WS_2$) after the ground state calculation in the ab-initio molecular dynamics simulations (AIMD) simulation were examined (not shown). Both DFT and AIMD simulations show the TMDs remain stable in single-layer and few-layer forms. The position of the TMD flake was then relaxed onto the graphene. The graphene is comprised of 288 atoms for a placement of a $MoS_2$ flake for a total of 324 atoms. A sectional portion of the $MoS_2$ flake in contact with the graphene was obtained (not shown). The contour color level indicates the degree of delocalized electrons. In the graphene, due to the covalent C—C bond, the electrons are highly delocalized between C atoms. However, delocalization is also observed in areas between the sulfur atoms in TMD and the carbon atoms on graphene as made evident by the similar color contour. This suggests that even though the dominant mechanism of chemical bonding remains the relatively weak vdW interaction, there is an observed charge redistribution between the graphene and the TMD in the TMD/graphene vdW heterostructures. This may allow for further tuning of the vdW interaction. The large reported work function between graphene (4.51 eV) and $MoS_2$ (5.52 eV) aids the ease in charge transfer between the two structures. To further assess this mechanism and the stability of the structure, the total cohesive energy of the TMD/graphene vdW heterostructures was evaluated, and a comparison was made between a structure wherein the TMD flake is placed close to the graphene (−2851.1328 eV) versus one where the flake is located far from the graphene (−2853.5725 eV). The energy comparison and the energy difference indicate a favorable gain in cohesive energy through the adsorption of the TMD flake, which can be attributed to charge transfer.

Figures 4A, 4B:
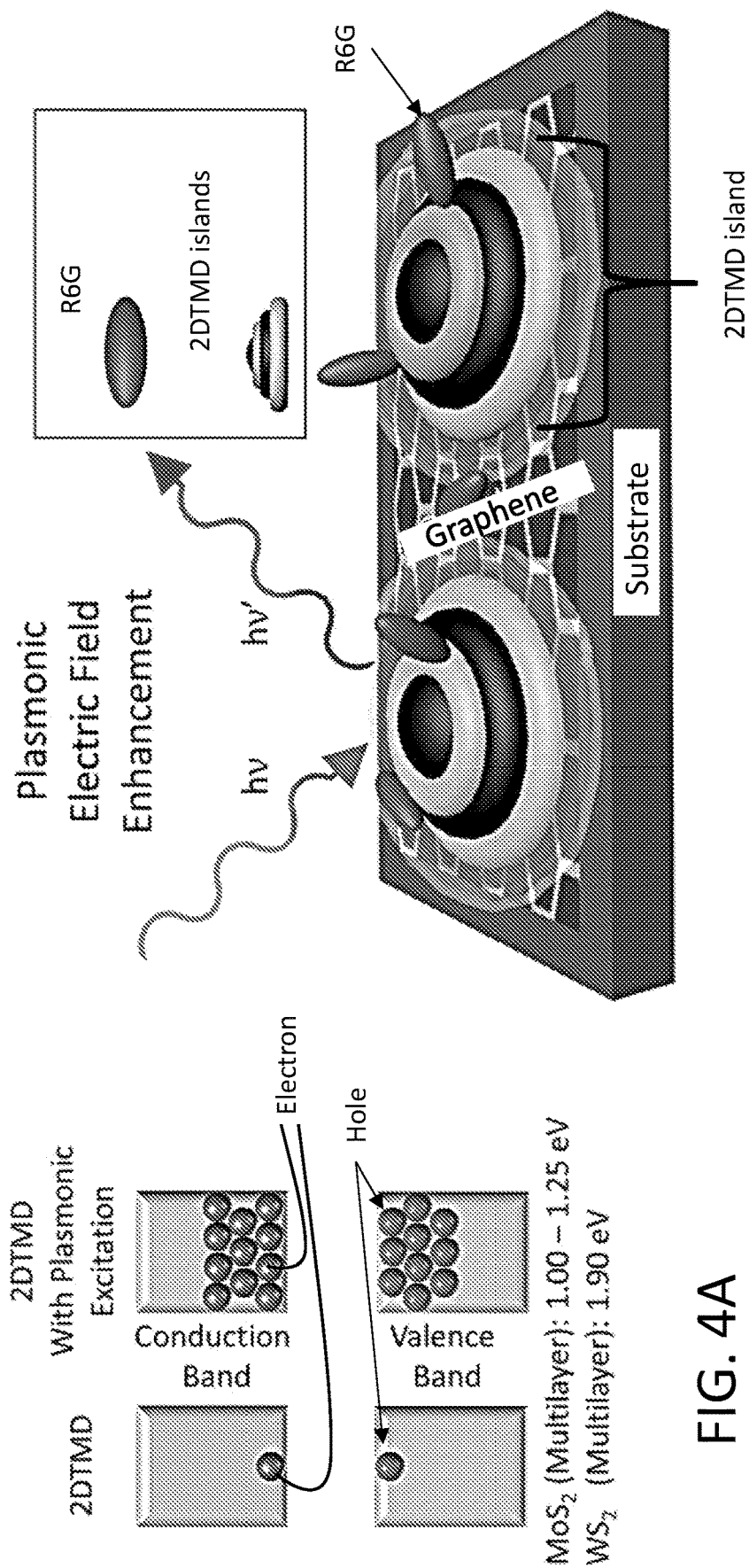
FIG. 4A is a schematic representation of electrons and holes in the conduction and valance bands, respectively, of few-layer transition metal dichalogenide (2DTMD) nanodomes. These carriers are generated via photodoping (carriers generated by the absorption of light) and electron delocalization at the TMD/graphene vdW interfaces and are the key to the observed localized surface plasmonic resonance (LSPR). As discussed herein, LSPR is negligible for comparative samples including continuous layers of TMD on graphene and 2D-TMDs without graphene.
FIG. 4B is a schematic illustration of TMD nanodomes/graphene vdW heterostructures on a $SiO_2$/Si substrate with R6G molecules covering the substrate, showing enhanced Raman scattering due to EM enhancement and CM enhancement.

Based on the insights gained from the simulation, a photo-doping LSPR mechanism on TMD nanodomes/graphene vdW heterostructures was proposed. As schematically depicted in FIGS. 4A-4B, the enhanced dipole-dipole interaction and charge transfer across the TMD/graphene vdW interface is critically important for the LSPR to be excited and sustained on TMD nanodomes, as the free carriers are excited to the conduction band upon optical excitation. The morphology of the TMD nanodomes enables localization of the plasmonic resonance and therefore the LSPR to be generated without any metal plasmonic nanostructures. It is believed that the metal-free TMD nanodomes/graphene vdW heterostructures may provide unique advantages on matching the LSPR resonance frequency via the electronic structures of the TMDs. In fact, some differences have been observed in the metal-free TMD nanodomes/graphene vdW heterostructures as compared to their metal nanostructure/graphene counterparts. First, both electrons and holes can participate in the LSPR in semiconductor TMD nanodomes/graphene since free electrons and holes are generated simultaneously upon light excitation, as shown in FIG. 4A. This may lead to more efficient plasmonic resonance or a reduced Ohmic loss due to the high carrier mobility in semiconducting TMD nanodomes. As mentioned earlier, the R6G SERS sensitivity up to $5\times10^{-12}$ M on the TMD nanodomes/graphene vdW heterostructures is comparable (and slightly better than) the best achieved on metal nanostructures/graphene SERS substrates. On the other hand, the LSPR frequency in semiconducting TMD nanodomes/graphene is expected to be broadband. This is supported by the much smaller difference of only 1-2 orders of magnitude between the resonance ($10^{-11}$–$10^{-12}$ at 532 nm excitation) vs. non-resonance ($10^{-10}$ M at 633 nm excitation) SERS sensitivities of R6G observed on the TMD nanodomes/graphene vdW heterostructures, rather than the 3-4 orders of magnitude difference on Au nanoparticles/graphene SERS substrate counterparts. This is particularly important for molecule sensing, since resonance SERS may not be possible for most molecules due to the limited availability of excitation laser frequencies.

Conclusions

In summary, a novel SERS substrate was developed by synthesizing TMD ($MoS_2$ and $WS_2$) nanodomes on single-layer CVD graphene transferred or directly grown (transfer-free) on $SiO_2$/Si (and others such as quartz, fused silica) wafers. This metal-free TMD nanodomes/graphene vdW heterostructure provides a high-performance SERS substrate with EM and CM enhancement, both of which are associated with the strong dipole-dipole interaction at the heterostructure interface as indicated by the DFT and AMID simulations. On R6G probe molecules, an extraordinary SERS sensitivity up to $10^{-12}$ M was obtained using a TMD nanodomes/graphene vdW heterostructure substrate. Importantly, the SERS sensitivity of TMD nanodomes/graphene vdW heterostructures is 4-5 orders of magnitude higher than that of the single-layer $MoS_2$, $WS_2$ or graphene substrates and is comparable and slightly better than the best reported plasmonic metal nanostructures/graphene SERS substrates. The high SERS sensitivity may be attributed to combination of the CM enhancement and the EM enhancement through the LSPR on the photo-doped TMD nanodomes/graphene. This result illustrates a new pathway in designing high-efficiency metal-free SERS substrates by engaging 2D vdW heterostructures that combine the superior and complementary optical and electronic properties of the constituent atomic layers.

Additional information, including data indicated above as not being shown may be found in U.S. Pat. Appl. No. 62/753,223, which is hereby incorporated by reference in its entirety.

Example 2

Introduction 2D materials vdW heterostructures provide an excellent platform for design of novel optoelectronics. In this Example, transition metal dichalcogenide $WS_2$ nanodiscs ($WS_2$-NDs) of lateral dimension of 200-400 nm and layer number of 4-7 were synthesized on graphene using a layer-by-layer, transfer-free CVD. On these $WS_2$-NDs/graphene vdW heterostructures, LSPR was achieved, resulting in remarkably enhanced light absorption as compared to the comparative devices with a continuous $WS_2$ layer ($WS_2$-CL/graphene). Remarkably, the photoresponsivity of 6.4 A/W on the $WS_2$-NDs/graphene photodetectors is seven times higher than that of the $WS_2$-CL/graphene vdW heterostructures (0.91 A/W) at an incident 550 nm light intensity of 10 $\mu W/cm^2$. Furthermore, the $WS_2$-NDs/graphene photodetectors exhibit higher sensitivity to lower light. Under 550 nm light illumination of 3 $\mu W/cm^2$, which is beyond the sensitivity limit of the $WS_2$-CL/graphene photodetectors, high photoresponsivity of 8.05 A/W and detectivity of $2.8 \times 10^{10}$ Jones are achieved at $V_{sd}$=5 V. This result demonstrates that the LSPR $WS_2$-NDs/graphene vdW heterostructure may be used for scalable high-performance optoelectronics applications.

Experimental Section

Transfer-Free CVD Graphene Synthesis: The synthesis of graphene was carried out into a quartz tube reactor (25 mm in diameter) inside of a horizontal CVD furnace. (Liu, Q. et al., *Carbon* 2016, 96, 203-211.) Briefly, a clean $SiO_2$/Si substrate was inserted into the center of the quartz tubular reactor. Then, $H_2$ (120 sccm) was introduced in the reactor while the temperature was increased until the desired temperature (1065° C.) was reached. Thereafter, $CH_4$ (30 sccm) was fed into the reactor to start graphene growth directly on the $SiO_2$/Si substrate. The growth time was maintained for 3 hours. Finally, after graphene growth, the furnace was naturally cooled to room temperature under the protection of $H_2$.

Growth of $WS_2$-NDs on Graphene: The synthesis of $WS_2$-NDs was carried out on the graphene/$SiO_2$/Si substrate. 10 mg of ammonium tetrathiotungstate $(NH_4)_2WS_4$ was dissolved in 10 mL of DMF to make a precursor solution with a concentration of 0.1 wt %. The solution was sonicated for 30 min for more dissolution. The $SiO_2$/Si substrate with graphene was dipped into the $(NH_4)_2WS_4$ precursor solution; then, the solution was spin-coated onto the graphene/$SiO_2$/Si substrate at 3000 rpm for 60 s. One dip coating followed by immediate spin coating at 3000 rpm resulted in a very thin layer of the precursor that segregated into NDs with small diameter (~200-400 nm). Increasing the number of dipping times (~1-5 times) into the precursor lead to different morphology for the $WS_2$ from NDs, large islands, to continuous layers. Afterward, the substrate was placed in the quartz tube CVD furnace and the temperature was raised to 450° C. under a flow of Ar:$H_2$ (40:10 sccm). 2 g of sulfur powder was placed in the upstream of the quartz tube. The pressure was maintained at 50 mTorr. Then, the sample was annealed for about 1 hour before cooling down naturally to room temperature. $WS_2$-CLs were synthesized using the otherwise same procedure except the sample was dip-coated a few times (~5 times) before spin-coating. That means one dip coating of the sample with the hydrophobic graphene clean surface into the $(NH_4)_2WS_4$ precursor solution was followed by immediate spinning at 3000 rpm, leading to the formation of NDs with small diameter (200-400 nm). More dip coating (2-3 times) resulted in NDs with larger diameter. Dip coating the sample five times or more forms a continuous layer of $WS_2$.

$WS_2$-NDs/graphene photodetector fabrication and characterization: The metal electrodes (source and drain) of Au (40 nm)/Ti (10 nm) were deposited on graphene using electron-beam evaporation through a metal shadow mask. The distance between the electrodes (graphene channel length) was about 250 $\mu$m. Then, the substrate was dipped into the precursor solution followed by spin-coating for a uniform layer covering the entire sample including the electrodes. Afterword, the substrate was placed in the CVD furnace for $WS_2$ growth. Raman spectra and Raman maps of graphene and $WS_2$ were collected using a Witec Alpha300-Confocal Raman Microscope. AFM on the same Witec system was employed to characterize the morphology and dimension of the $WS_2$-NDs. Current-voltage (I-V) characteristics of the photodetectors were measured using a CHI660D electrochemical workstation. The temporal photoresponse measurements, at 550 nm illumination with different powers and different bias voltage, were performed using an Oriel Apex monochromator illuminator.

Results and Discussion

Figures 5A, 5B:
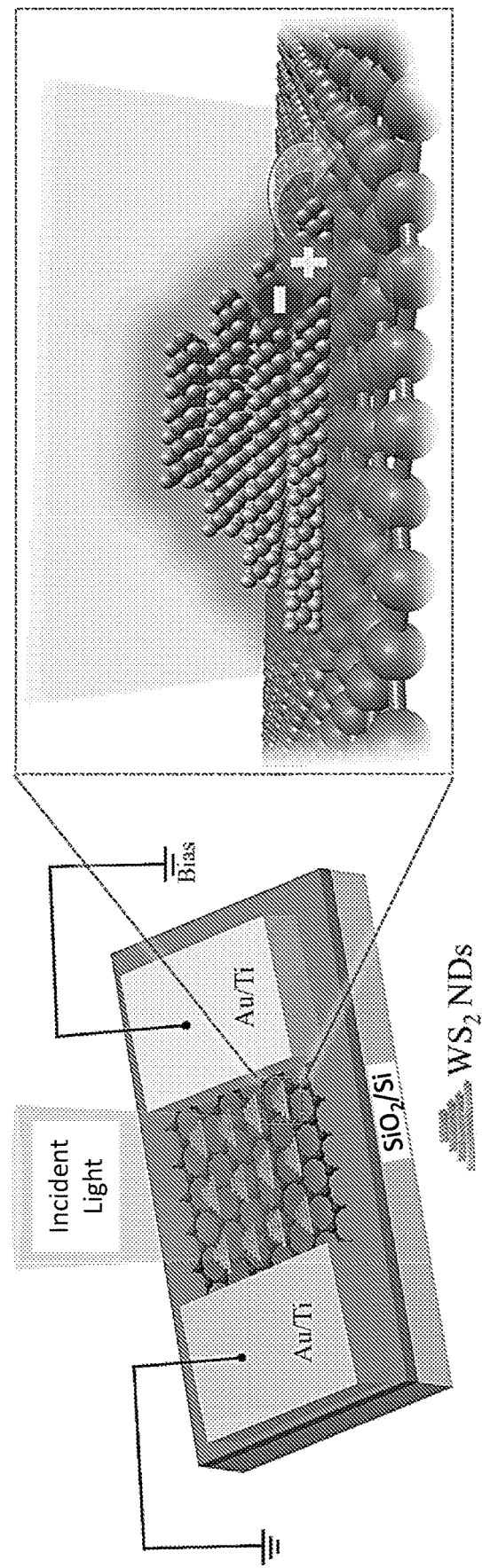
FIG. 5A is a schematic illustration of a photodetector based on $WS_2$-NDs/graphene vdW heterostructures.
FIG. 5B is a zoomed-in view of the $WS_2$-NDs/graphene photodetector with an illustration of the charge transfer process at the interface between a $WS_2$ nanodome and graphene.
Figure 5C:
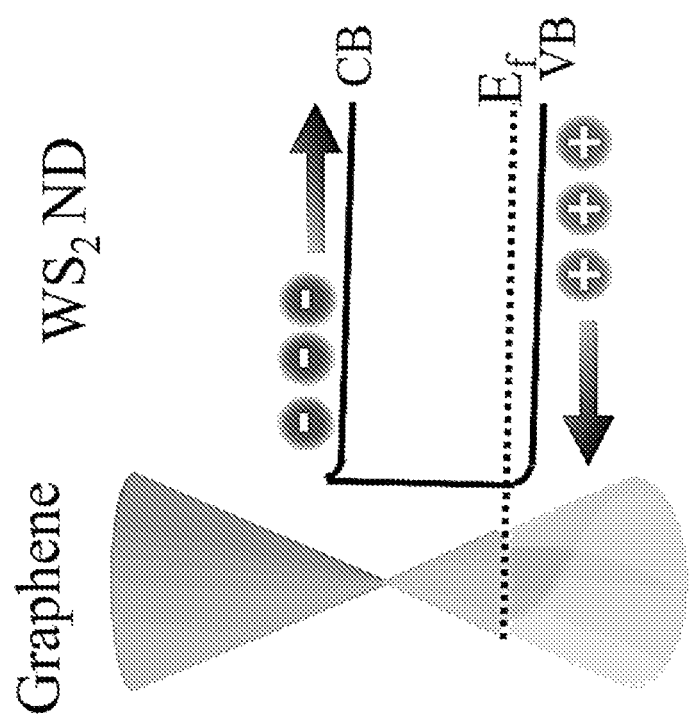
FIG. 5C is an electronic band diagram of p doped graphene and the $WS_2$-NDs ($E_f$: the Fermi level, CB: conduction band, and VB: valence band).

FIG. 5A shows the schematic diagram of the $WS_2$-NDs/graphene vdW heterostructure photodetector with the source and drain electrodes. Under light illumination, the photoexcited electron-hole pairs are generated in the $WS_2$-NDs and separated at the $WS_2$-NDs/graphene interface due to the built-in electric field. In the $WS_2$-NDs, a strong LSPR can be induced via carrier doping of semiconducting $WS_2$-NDs as depicted schematically in FIG. 5B. This results in enhanced light-solid interaction and hence light absorption in $WS_2$-NDs as compared to the case of the $WS_2$-CL. FIG. 5C illustrates the electronic band diagrams of the WS$_2$-NDs and the p-doped graphene at their interface. The p-type doping effect in CVD graphene is common due to adsorbed polar molecules such as H$_2$O on graphene in ambient conditions. Based on the interface band diagram, the holes dissociated from electron-hole pairs are injected into graphene, and the electrons remain trapped in the WS$_2$-NDs before they recombine with holes. After the transfer, the holes will drift along the graphene channel with high mobility between source and drain electrodes under a bias voltage (V$_{sd}$) with a short transit time $\tau_{transit}$, which is given by $$\tau_{transit} = \frac{L^2}{\mu V_{sd}} \quad (1)$$

where L is the graphene channel length µ is the carrier mobility. The trapped electrons in the WS$_2$-NDs have an exciton lifetime $\tau_{exciton}$ that is significantly longer than the $\tau_{transit}$ due to the quantum confinement in the WS$_2$-NDs and high carrier mobility of graphene, allowing the holes to circulate multiple times before they recombine with electrons. Consequently, a high photoconductive gain (G) defined by $$G = \frac{\tau_{exciton}}{\tau_{transit}} \quad (2)$$

can be achieved.

Figure 6B:
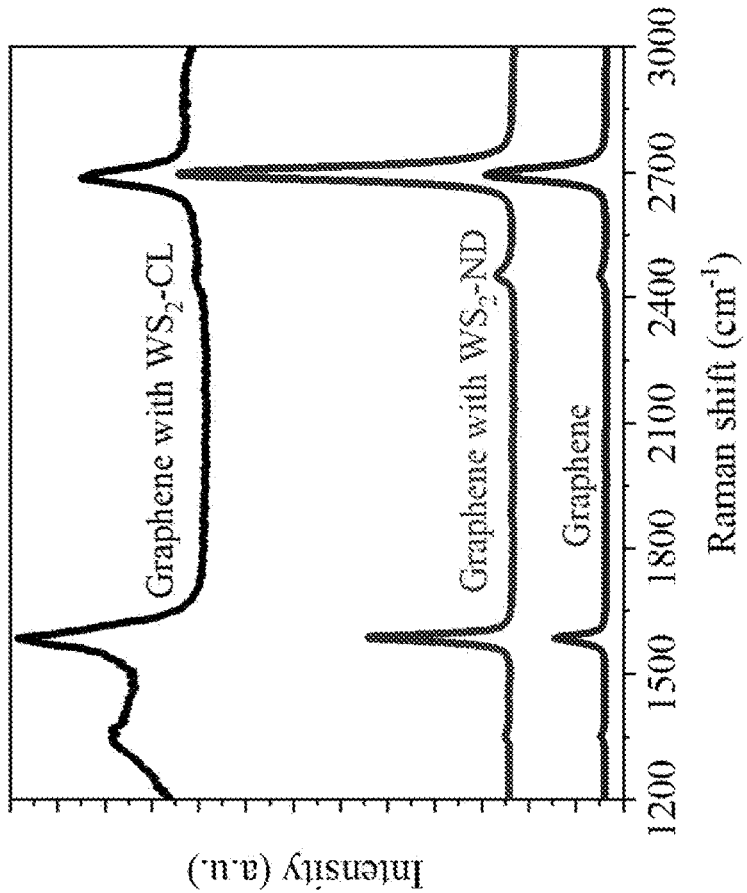
FIG. 6B shows Raman spectra of graphene with $WS_2$-NDs, with a $WS_2$-CL, and without $WS_2$.
Figure 6A:
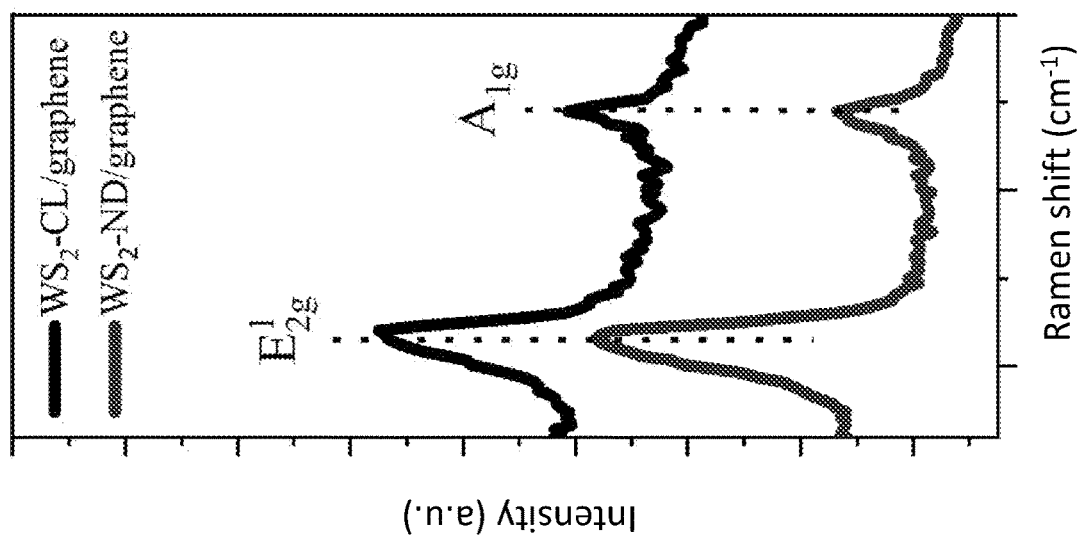
FIG. 6A shows Raman spectra of $WS_2$-continuous layer (CL) and $WS_2$-ND on graphene.
Figure 7B:
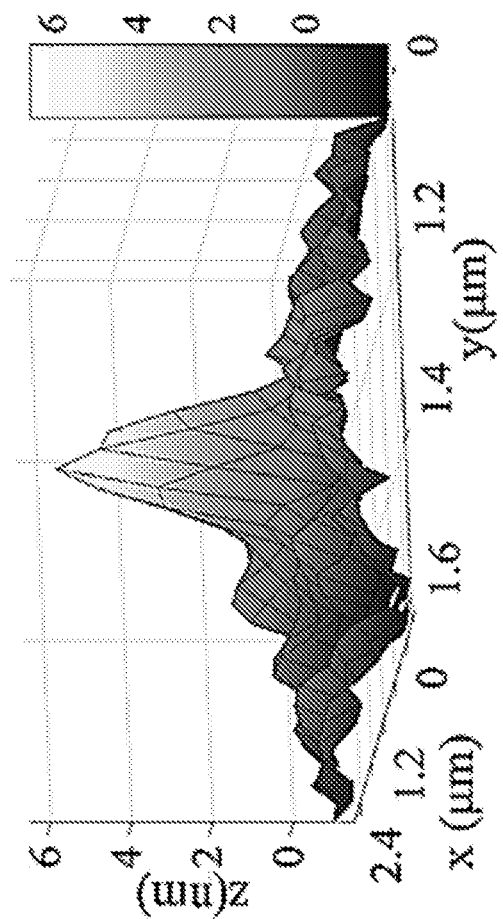
FIG. 7B shows a 3D image for a $WS_2$-ND with thickness of ~5 nm and lateral dimension of ~200 nm.
Figure 7A:
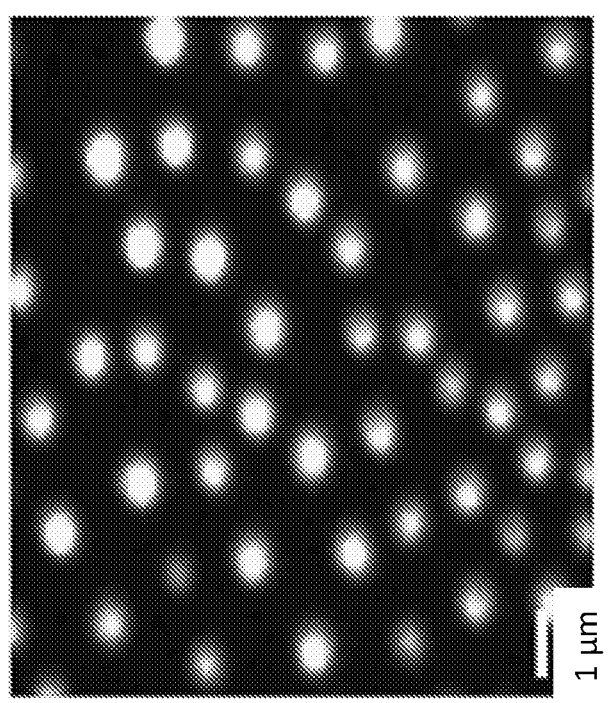
FIG. 7A shows a 10×10 $\mu m^2$ Raman mapping image for the $E^1_{2g}$ peak of $WS_2$-NDs.

An optical image of the WS$_2$-NDs/graphene vdW heterostructure was obtained (not shown). The sample looks fairly uniform in large area. As shown in FIG. 6A, the two characteristic peaks of WS$_2$-NDs, at 357.16 cm$^{-1}$ and 421.9 cm$^{-1}$ were observed in the Raman spectrum. These two peaks correspond to the in-plane E$^1_{2g}$ mode and out of plane A$^1_g$ mode of WS$_2$. The full width at half maximum (FWHM) of E$^1_{2g}$ and A$^1_g$ Raman peaks are about 18.95 cm$^{-1}$ and 8.55 cm$^{-1}$, respectively, illustrating good crystallinity with moderate defects. However, these FWHM values of WS$_2$-NDs are relatively larger than that reported for the crystalline exfoliated WS$_2$ of 11.17 cm$^{-1}$ and 4.67 cm$^{-1}$, which suggests the presence of growth defects in the WS$_2$-NDs. Consequently, the WS$_2$-NDs may be doped due to the presence of the defects, which may contribute to the LSPR effect as to be discussed below. The Raman spectrum of the WS$_2$-CL is also included in FIG. 6A. The slight blue-shift of the E$^1_{2g}$ mode to 360.26 cm$^{-1}$ could be attributed to the smaller number of layers of the WS$_2$ (2-3) as opposed to that WS$_2$-NDs (4-7). The Raman characteristic G and 2D peaks of graphene at ~1597.32 cm$^{-1}$ and 2722 cm$^{-1}$, respectively, are clearly seen on three samples in FIG. 6B: graphene, graphene with WS$_2$-NDs, and graphene with WS$_2$-CL. It should be noted that the total amount of the WS$_2$ material is much more in the WS$_2$-CL/graphene as compared to the WS$_2$-NDs/graphene samples because of thicker coating of the precursor in the former. The larger number of the WS$_2$ layer number may be attributed to the segregation of the very thin WS$_2$ into WS$_2$-NDs in the latter case. The G peak corresponds to the E$^1_{2g}$ phonon at the Brillouin zone center, and the 2D peak is the second order of the D peak that corresponds to A$^1_g$ breathing mode. The low intensity of the D peak for the graphene at 1357.12 cm$^{-1}$ on graphene and graphene with WS$_2$-NDs indicates the high quality of the transfer-free graphene that remains intact after the growth of WS$_2$-NDs. As shown in FIG. 6B, the G and 2D peaks of graphene with the WS$_2$-NDs are enhanced by 2.6 and 3 times, respectively, as compared to that on graphene without the WS$_2$-NDs. The enhancement is attributed to the LSPR of the WS$_2$-NDs. However, no such enhancement was observed in the WS$_2$-CL/graphene case. Moreover, an enhanced D peak (defects) and a reduced I$_{2D}$/I$_G$ ratio on this sample can be attributed to the interfacial interaction of graphene with WS$_2$-CL. While the mechanism underlying the LSPR in WS$_2$-NDs requires further investigation, two mechanisms are likely contributing to the LSPR in WS$_2$-NDs. First, semiconductor nanocrystals can exhibit plasmonic effect upon carrier doping induced either via chemical composition control or/and defects. On the other hand, the reduction of the WS$_2$ lateral dimension to nanodiscs is critical, as discussed in the following through a comparative study of the WS$_2$-NDs/graphene and WS$_2$-CL/graphene photodetectors. FIG. 7A displays the Raman intensity map of the E$^1_{2g}$ peak of the WS$_2$. The Ramen intensity map of graphene is not shown. The map shows the "disc-like" morphology of the WS$_2$-NDs with an average lateral dimension <500 nm grown on a continuous layer of transfer-free CVD graphene. FIG. 7B shows an AFM image illustrating the disc-like shape, the height, and the lateral dimensions of a WS$_2$-ND. Based on the AFM analysis over multiple samples, the WS$_2$-NDs have a lateral dimension on the order of 200-400 nm and a height of 3-5 nm. This means that the WS$_2$-NDs are multilayers with the layer number ranging from 4 to 7 layers of WS$_2$. Additional AFM images and height profiles of WS$_2$-NDs on graphene were obtained (not shown). The importance of the geometry change can be illustrated in the LSPR enhancement factor that is defined as the ratio of the graphene Raman 2D peak with and without WS$_2$-NDs under the same Raman measurement condition. As shown in FIG. 6B, no LSPR enhancement can be observed on WS$_2$-CL/graphene while a strong LSPR enhancement can be observed on WS$_2$-NDs/graphene samples. The LSPR enhancement factor of the WS$_2$-NDs/graphene sample was further investigated as a function of the optical power using excitation lasers of 532 nm (data not shown). The 2D peak of graphene was used to illustrate the LSPR because the enhancement of the local electric field due to WS$_2$-NDs will enhance the inelastic light Raman scattering of graphene and hence increase the intensity of the 2D peak. The enhancement factor of the 2D peak of graphene has a moderate dependence on the excitation power with a shoulder observed at 0.2-0.4 mW. Below the shoulder, the enhancement factor is around 2.3-2.4 and above the shoulder, it increases with the increasing power up to ~3.4 at 0.8 mW, followed with a slow deceasing to about 2.7 at 10 mW. This power dependence of the LSPR enhancement factor suggests photo-doping may play an important role in the LSPR effect of the WS$_2$-NDs. An characteristic curve of the WS$_2$-NDs/graphene photodetector in the dark and in response to illumination (at 550 nm) with a fixed optical power of 100 mW was obtained (not shown). The illuminated current increases linearly as the bias voltage varies from 0 to 6 V due to the increase in carrier drift velocity and the decrease in transit time of the carrier between the electrodes. The linear I-V curve indicates an Ohmic contact between the heterostructure and electrodes. The difference between the illuminated and dark currents is defined as photocurrent(I$_{ph}$=I$_{light}$-I$_{dark}$).

The dynamic photocurrent in response to light on and off at different bias voltages and different illumination powers at 550 nm was obtained (not shown). The photocurrent decreases with decreasing both the bias voltage and the power of the incident light, which is attributed to the decreased of number of photo-generated exciton (electron-hole pairs) as the incident optical power decreases from 12 to 0.15 µW. The dynamic photocurrent in response to multiple pulses of the 550 nm light illumination was obtained (not shown), indicating a fast and stable photoresponse. The temporal photoresponse of the photodetector is characterized by a typical rise and fall time ($t_{rise}$ and $t_{fall}$). The $t_{rise}$ is the required time for the photocurrent to rise from 10% to 90% of its maximum and the $t_{fall}$ is the time the photocurrent takes to decay from 90% to 10%. For the $WS_2$-NDs/graphene devices, the $t_{rise}$=10 ms and $t_{fall}$=20 ms at $V_{sd}$=5 V is slightly faster than $MoS_2$-CL/transfer-free graphene (20 ms-30 ms) under the same conditions and also faster than $MoS_2$/transferred-graphene (3.2 s-1.2 s). To elucidate the impact of the LSPR effect in the $WS_2$-NDs/graphene on the performance of the photodetectors, a comparative study of the photoresponse was carried out on the $WS_2$-NDs/graphene photodetectors with different $WS_2$-ND areal density and $WS_2$-CL/graphene photodetectors. The photodetectors are fabricated and measured under the same conditions. Optical images and Raman maps were obtained (not shown) for the $WS_2$ on graphene, including higher $WS_2$-NDs areal density, lower $WS_2$-NDs areal density, and $WS_2$-CL. The dynamic photoresponse and photoresponsivity of these three samples were compared (not shown). The highest measured values for photocurrent and the photoresponsivity (23 µA, 6.4 A/W) were observed on the $WS_2$-NDs/graphene sample with denser and smaller lateral size (200-400 nm). In the case of a less dense and larger size $WS_2$-NDs (~500-1200 nm), the photocurrent and the photoresponsivity are decreased to 18 µA and 2.5 A/W, respectively. The lowest measured values for the photocurrent (11 µA) and the photoresponsivity (0.912 A/W) were found on the photodetector with a continuous layer of $WS_2$ on graphene. The obtained values demonstrate the dependence of photocurrent and photoresponsivity on the $WS_2$ morphology. The photodetector with smaller and denser $WS_2$-NDs shows a better performance. The optical absorption spectra of the $WS_2$-NDs with different size and density over the wavelength range of 400-900 nm were taken. The $WS_2$-NDs sample with smaller sizes and more density exhibited a higher absorption (not shown). The photoresponsivity (R) is an important figure-of-merit for a photodetector and is defined as $$R = \frac{I_{ph}}{P_{in}} \quad (3)$$

where $P_{in}$ is the illumination power.

R values measured on $WS_2$-NDs/graphene and $WS_2$-CL/graphene devices as a function of incident light intensity were compared (not shown). The R values of both devices decrease monotonically with increasing incident power, while the photocurrent increases with increasing the power of incident light. The decrease in the R value is ascribed to the decreasing of charge carrier concentration which result in a lower e-h recombination. At lowest power density of 10 µW/cm², the $WS_2$-NDs/graphene photodetector has a photoresponsivity of 6.4 A/W, which is seven times higher than the 0.91 A/W on the $WS_2$-CL/graphene counterpart. This illustrates the impact of the enhanced light absorption in $WS_2$-NDs as compared to the $WS_2$-CL. It should be noted that the R values on the $WS_2$/graphene vdW heterostructure photodetectors are considerably higher than that reported for $WS_2$ (0.0.0188 A/W) and for graphene (0.0061 A/W). Photocurrent response of both photodetectors to light illumination (λ=550 nm) at a bias of 5V were obtained (not shown). The enhancement of photocurrent is clearly observed. The optimized performance of the $WS_2$-NDs/graphene photodetector can be attributed to the LSPR of $WS_2$-NDs. The spectral photoresponsivity of the $WS_2$-NDs/graphene and $WS_2$-CLs/graphene photodetectors were compared (not shown). Overall, the photoresponsivity over the entire wavelength range of 400-800 nm is higher in the $WS_2$-NDs/graphene devices as compared to that of the $WS_2$-CLs/graphene. This enhanced photoresponsivity is attributed to the enhanced light absorption by the LSPR $WS_2$-NDs. It should be noticed that a broad peak of photoresponsivity is present at ~500-550 nm, most probably corresponding to the LSPR wavelength of the $WS_2$-NDs upon photo-doping. The results revealed that the LSPR $WS_2$-NDs can provide photosensitizers for enhanced performance in vdW photodetectors.

The reduction of the photocurrent as the light power decreases from 12 to 0.15 µW, measured at a 5 V bias and 550 nm illumination, was observed (not shown). The photocurrent reduction is due to the decrease of photo-generated excitons and hence free carriers. The external quantum efficiency (EQE) of the $WS_2$-NDs/graphene photodetector was measured (not shown). The EQE can be calculated by $$EQE = \frac{(I_{ph}/e)}{(P_{in}/h\nu)} \quad (4)$$

where h is Planck's constant, ν is the frequency of incident light, and e is the electron charge. An EQE of 1800% was observed at the lowest power intensity, and it decreases with an increase in the power intensity. The detectivity (D*) is another figure of merit of photodetectors, and it can be defined as $$D^* = \frac{A^{1/2}}{NEP} = R\, A^{1/2}/i_n^{2\,1/2} \quad (5)$$

where A is the active area of the device, NEP is the noise equivalent power, and $i_n^2$ is the noise current. It was assumed that the total noise limiting the detectivity is dominated by shot noise from $I_{dark}$, hence the D* can be expressed as $$D^* = R\left[\left(\frac{A}{2eI_{dark}}\right)\right]^{1/2} \quad (6)$$

where $I_{dark}$ is the dark current. The calculated D* for the $WS_2$-NDs/graphene photodetector was about $2.8 \times 10^{10}$ Jones. The EQE and D* were measured at a 5 V bias under light illumination of 550 nm with light intensity of 3 µW/cm². It should be mentioned that at this low light power density of 3 µW/cm², the $WS_2$-CLs detectors did not show any measurable responses, indicating the $WS_2$-NDs/graphene photodetectors have larger dynamic range extending to lower light The results have revealed that the TMDC-NDs/graphene photodetectors can improve the photodetection as compared to the previously reported photodetectors based only on continuous 2D material sheets as well as on the TMDC-CLs/graphene photodetectors (Table 1).

TABLE 1

Comparison of the performance of photodetectors composed of graphene, 2D TMDC layers and their heterostructures.

| Device structure | $V_{SD}$ (V) | $V_{BG}$ (V) | R (A/W) | $\tau_{rise}/\tau_{fall}$ (ms) | $\lambda$ (nm) | Channel Length (μm) | Refs. |
|---|---|---|---|---|---|---|---|
| Graphene | 0 | 60 | 0.001 | — | 632.8 | 1.45 | Xia, F. et al., *Nano letters* 2009, 9 (3), 1039-1044 |
| WS$_2$ | — | 20 | 0.0188 | 60/190 | 532 | 30 | Lan, C. et al., *Nanoscale* 2015, 7 (14), 5974-5980. |
| MoS$_2$ | 1 | 50 | 0.0075 | 50/50 | 550 | 5 | Yin, Z. et al., *ACS nano* 2011, 6 (1), 74-80. |
| MoS$_2$/graphene | 0.1 | −20 | 10 | 280/1500 | 632.8 | ~20 | Xu, H. et al., *Small* 2014, 10 (11), 2300-2306. |
| MoS$_2$/graphene | 5 | 0 | 0.835 | 20/30 | 540 | 250 | Liu, Q. et al., *ACS applied materials & interfaces* 2017, 9 (14), 12728-12733. |
| MoTe$_2$/graphene | −2 | 0 | 0.02 | 30/30 | 532 | ~10 | Kuiri, M. et al., *Applied Physics Letters* 2016, 108 (6), 063506. |
| WS$_2$-CLs/graphene | 5 | 0 | 0.91 | 10/20 | 550 | 250 | This Example |
| WS$_2$-NDs/graphene | 5 | 0 | 6.4 | 10/20 | 550 | 250 | This Example |

In conclusion, WS$_2$-NDs were successfully synthesized on transfer-free graphene using a layer-by-layer CVD process. Specifically, WS$_2$-NDs with a lateral dimension of ~200-400 nm and WS$_2$ layer number of 4-7 were obtained by coating a very thin layer of the (NH$_4$)$_2$WS$_4$ precursor solution followed by annealing at 450° C. under a flow of mixed gases of Ar and H$_2$. In contrast, a continuous layer of WS$_2$ was typically obtained using a thicker precursor solution layer. Photodetectors of WS$_2$-NDs/graphene and WS$_2$-CL/graphene heterostructures were fabricated and characterized in the visible spectrum. Interestingly, the lateral confinement of the electrons in WS$_2$-NDs leads to a strong LSPR effect as illustrated in enhanced Raman signatures of graphene by up to 3.4 in the WS$_2$-NDs/graphene heterostructures. In contrast, no such enhancement was observed on WS$_2$-CL/graphene. The LSPR effect enhances the photoresponse of the WS$_2$-NDs/graphene photodetectors considerably as compared to their counterparts based on the WS$_2$-CL/graphene. Under 550 nm light illumination of power intensity of 3 μW/cm$^2$ and bias voltage of 5 V, the WS$_2$-NDs/graphene photodetectors exhibited photoresponsivity of 8.05 A/W, an EQE of 1800%, and a detectivity of 2.8×10$^{10}$ Jones. Because the light intensity of 3 μW/cm$^2$ is beyond the detection limit of the WS$_2$-CL/graphene photodetectors, the performance of the two photodetectors were compared at a higher intensity of 10 μW/cm$^2$ at 550 nm. The WS$_2$-NDs/graphene photodetectors exhibited seven times higher photoresponsivity of 6.4 A/W than the 0.91 A/W of the WS$_2$-CL/graphene vdW heterostructures photodetectors. This result demonstrates the important role of the LSPR effect in enhancing the light absorption in WS$_2$-NDs and hence the performance of the WS$_2$-NDs/graphene photodetectors. Finally, the layer-by-layer transfer-free approach developed for fabrication of the WS$_2$-NDs/graphene heterostructures is low-cost and scalable for commercialization of high-performance optoelectronic devices.

Example 3

Introduction

As described in Examples 1 and 2 above, WS$_2$ nanodomes/graphene vdW heterostructures have been demonstrated to have remarkable SERS sensitivity due to the LSPR on WS$_2$-NDs enabled by enhanced dipole-dipole interaction at the vdW interface. This Example explores the superposition of the LSPR effect of Au nanoparticles (AuNPs) with that of the WS$_2$-NDs/graphene by evaporating AuNPs on WS$_2$-NDs/graphene vdW heterostructures Enhanced LSPR has been obtained from the enhanced Raman signatures of graphene on the AuNPs/WS$_2$-NDs/graphene as compared to the case of graphene only, WS$_2$-NDs/graphene, and AuNPs/graphene, illustrating the benefit of this superposition. Furthermore, Raman spectra of probe molecules of fluorescent R6G were taken using AuNPs/WS$_2$-NDs/graphene SERS substrates. Remarkably, a resonant SERS sensitivity up to 1×10$^{-12}$ M has been obtained, which is more than one order of magnitude higher than that on WS$_2$-NDs/graphene and on the plasmonic metal nanostructure/graphene, and a few orders of magnitude higher than that on TMDs/metal nanostructure. This result demonstrates the benefit of superposition of LSPR effects from different nanostructures through design of vdW heterostructures, which may be used as high-sensitivity SERS substrates that are scalable for commercial applications in optoelectronics and sensing.

Experimental

CVD synthesis of graphene. Graphene samples were synthesized using a CVD system on polycrystalline copper foils (Alfa Aesar) in a quartz tube inside a CVD furnace at 1050° C. with a combination of H$_2$ and CH$_4$ with flow rate of 7 sccm and 40 sccm, respectively, followed with wet transfer on silicon substrate using a multistep process. (Cook, B. et al., *J. Mater. Chem. C* 2017, 5 (38), 10087-10093; and Gong, M. et al., *ACS Nano* 2017, 11 (4), 4114-4123.) Briefly, PMMA was spin-coated on graphene film, and then the sample was annealed at 120° C. Afterwards, the Cu/graphene/PMMA was immersed (with the PMMA side up) in copper etchant for about 4 hours at room temperature to completely dissolve the Cu foil. The suspended graphene/PMMA layer was then moved to deionized water multiple times to remove residual copper etchant. The graphene/PMMA films were transferred onto the SiO$_2$ (90 nm)/Si. The graphene/PMMA films were left to dry overnight. The PMMA layer was removed by immersion in acetone (multiple times) and isopropanol (IPA) and then dried with a N$_2$ gas gun. Thermal annealing at 400° C. in mix of Ar/H$_2$ gas (500 sccm/300 sccm) for 30 minutes was used to clean the polymer residues on graphene.

Synthesis of WS$_2$-NDs on graphene. The ammonium tetrathiotungstate (NH$_4$)$_2$WS$_4$ precursor solution was prepared by dissolving in DMF with a concentration of 0.1 wt %. Then, the graphene/SiO$_2$/Si samples were immersed in the (NH$_4$)$_2$WoS$_4$ precursor solution, followed with spin-coating at 3000 rpm for 1 min to obtain an ultrathin uniform film that can segregate into nanodomes on graphene with heating. Then the samples were annealed at 450° C. for 30 minutes in the quartz tube of a CVD furnace with a mixed gas of 10 sccm H$_2$ and 50 sccm Ar gas. Sulfur powder was placed in the upstream region of the quartz tube at a distance of ~25 cm from the sample, and the sulfur source temperature was at approximately 200° C.

Fabrication of Plasmonic AuNPs on/WS$_2$-NDs/graphene. Plasmonic AuNPs were formed in high vacuum via heat-assisted self-assembly during e-beam evaporation of Au of nominal thickness of 10-12 nm on the WS$_2$/graphene heterostructure samples at sample temperature ~300° C.

Characterization of AuNPs/WS$_2$-NDs/graphene SERS Substrates. Surface morphology, crystallinity, and microstructure of the WS$_2$NDs/graphene heterostructures were examined using AFM and Raman spectroscopy using a confocal Raman system (WiTec alpha 300) with laser excitation of 433 nm.

Raman Spectra of R6G on AuNPs/WS$_2$-NDs/graphene SERS substrates. For SERS characterization of R6G probe molecules, a droplet of R6G (~4-5 mm in diameter) with the concentration in the range of $5 \times 10^{-5}$ M to $5 \times 10^{-12}$ M was casted onto the surface of the substrates and left to dry on a hotplate at 70° C. for 1 hour. Raman spectroscopy, using a confocal Raman system (also WiTec alpha 300), with laser excitation of 532 nm and 633 nm was used for SERS characterization. The areal density of the molecules can be estimated from the R6G concentration, the droplet volume, and the dimension of the R6G samples on the SERS substrates. For a droplet of ~4-5 mm in diameter and R6G concentration of $5 \times 10^{-5}$ M, the number of R6G molecules in the droplet is around $10^{12}$ molecules. After the R6G droplet dried, a circular spot with area of ~12 mm$^2$ was formed. The number of molecules per unit area in the spot can be estimated by dividing the number of R6G molecules in the droplet by the dried spot area. Thus, the number of molecules per unit area in the spot was ~$10^4$-$10^5$ molecules/μm$^2$ at dilution of the $5 \times 10^{-5}$ M and ~$2 \times 10^{-2}$ molecules μm$^2$ at dilution of the $5 \times 10^{-12}$ M. With the laser beam area, the number of molecules under detection can be estimated. The sub-millimeter laser beam spot (~tens μm in dimeter) with a 20× microscope objective was reasonably small, allowing multiple scan locations in the center of each drop during the Raman measurement. A low intensity (~1-5 mW) and small integration time of 3 s were used to avoid damage of the R6G molecules. For improved signal to noise ratio, each demonstrated spectrum is an average of several spectra taken on the same sample spot.

Results and Discussion

Figure 8B:
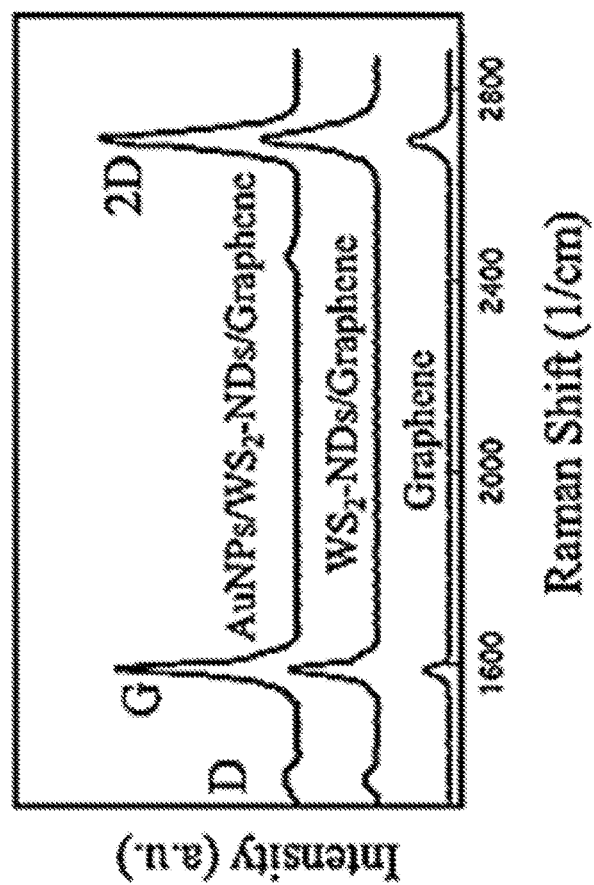
FIG. 8B shows Raman spectra of graphene taken on three samples of graphene only, $WS_2$ NDs/graphene, and AuNPs/$WS_2$-NDs/graphene using 488 nm laser of power of 1 mW.

FIG. 8A schematically illustrates the AuNPs/WS$_2$-NDs/graphene vdW heterostructure for R6G detection as a SERS substrate. The Raman signatures of the R6G probe molecules attached to the substrate are enhanced by both the EM and CM effects. In order to quantify the LSPR enhancement by the integrated plasmonic AuNPs/WS$_2$-NDs, Raman spectra of graphene were taken on graphene only, WS$_2$-NDs/graphene, and AuNPs/WS$_2$-NDs/graphene, and the results are shown in FIG. 8B. On all three samples, the graphene's defect D-peak at ~1356 cm$^{-1}$ has an insignificant intensity, confirming the high quality of the graphene synthesized using CVD for this Example. The two main signatures of graphene (i.e., the G peak at ~1587 cm$^{-1}$ due a primary in-plane vibrational mode and the 2D peak at 2695 cm$^{-1}$ due to a secondary in-plane vibration of zone-boundary phonons) are clearly observable. On the graphene only sample, the ratio of the 2D and G peak intensities is around 2.1, which is expected for monolayer graphene. However, the peak intensities differ quantitatively due to the LSPR effect at the same Raman measurement condition of 488 nm excitation of a power of 1 mW. In fact, the G peak and 2D peak intensities are considerably enhanced with decoration of the plasmonic WS$_2$-NDs and AuNPs/WS$_2$-NDs. On the WS$_2$-NDs/graphene sample, the G peak and 2D peak intensities were increased by a factor of 3.7 and 3.0, respectively. On the AuNPs/WS$_2$-NDs/graphene samples, the enhancement factors on the graphene G and 2D peaks are further increased to about 6.5 and 4.7, respectively. The further enhancement of the graphene signatures in the AuNPs/WS$_2$-NDs/graphene as compared to that of the WS$_2$-NDs/graphene is attributed to the superposition of the LSPR effects from the plasmonic AuNPs and plasmonic WS$_2$-NDs. The enhanced LSPR effect of the AuNP/WS$_2$-NDs is likely due to the increased dipole-dipole interaction at the AuNP/WS$_2$-NDs vdW interface as evidenced by a DFT simulation (not shown).

Raman spectra taken on graphene and on WS$_2$-NDs/graphene vdW heterostructures were obtained (not shown). Besides the graphene signature peaks at ~1587 cm$^{-1}$ and ~2695 cm$^{-1}$ corresponding to the graphene's G and 2D bands and a small disorder induced D band at 1350 cm$^{-1}$, the Raman peaks associated to the WS$_2$-NDS grown on top of the single-layer graphene can be observed at ~342 cm$^{-1}$ ($E_{2g}^1$) and ~412 cm$^{-1}$ ($A_{1g}$) due to, respectively, the in-plane displacement of Mo and S atoms and the out-of-plane displacement of S atoms. Raman maps of graphene (2D mode) and WS$_2$ ($E_{2g}^1$ mode) on the WS$_2$-NDs/graphene sample using the excitation laser of 488 nm in wavelength were obtained (not shown). Graphene's Raman map shows continuous distribution with lower intensity on regions covered by the WS$_2$ nanodomes. The Raman map of the WS$_2$ ($E_{2g}^1$ mode) exhibits an opposite intensity distribution, demonstrating the formation of the WS$_2$ nanodomes with lateral dimension on the order of 300-500 nm (data not shown). AFM images and scanning electron microscopy (SEM) images of AuNPs on WS$_2$/graphene heterostructures were also obtained (not shown), which reveal the WS$_2$ has a nanodome shape with lateral dimension of 300 nm-500 nm. The heights of the WS$_2$-NDs and AuNPs were about 5-6 nm for the WS$_2$-NDs and about 10-15 nm for AuNPs. SEM shows the AuNPs are decorated uniformly throughout the sample, including on top of the WS$_2$-NDs. The AuNPs have are rounded and have a lateral dimension ~40-50 nm.

Figure 9:
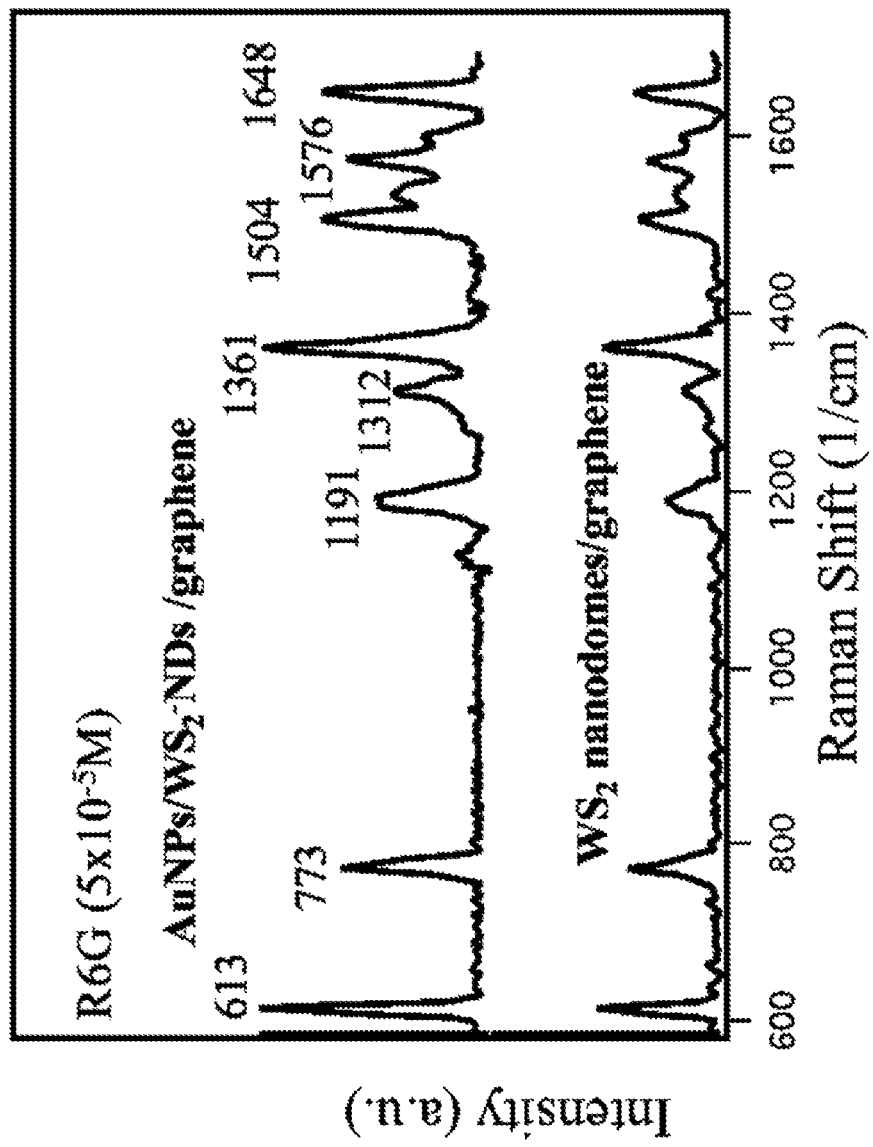
FIG. 9 shows Raman spectra of R6G molecules at the concentration of $5\times10^{-5}$ M deposited on AuNPs/$WS_2$-NDs/graphene and $WS_2$-NDs/graphene heterostructures substrates with excitation length of 532 nm.

The R6G Raman spectra were collected on two different substrates of WS$_2$-NDs/graphene with and without the AuNPs using the excitation wavelength of 532 nm. FIG. 9 shows the comparison of Raman spectra of R6G ($5 \times 10^{-5}$ M) on AuNPs/WS$_2$-NDs/graphene heterostructures, and WS$_2$-NDs/graphene heterostructures substrates. A larger enhancement of R6G Raman signatures can be clearly observed on the AuNPs/WS$_2$-NDs/graphene heterostructures as compared to that on the WS$_2$-NDs/graphene ones. A series of R6G Raman peaks can be identified, including the 613 cm$^{-1}$ peak assigned to the C—C—C ring in-plane vibration mode, the 769 cm$^{-1}$ peak assigned to the aromatic C—H bending mode, and the 1312 cm$^{-1}$ and 1502 cm$^{-1}$ peaks assigned to the N—H in plane bend mode. The peaks at 1361 cm$^{-1}$, 1504 cm$^{-1}$, 1576 cm$^{-1}$, and 1648 cm$^{-1}$ can be assigned to the C—C stretching mode, and the 1190 cm$^{-1}$ peak can be assigned to the C—O—C stretching mode. Overall, the R6G Raman signature peaks are more intensive on the AuNPs/WS$_2$-NDs/graphene substrate as compared to that on the WS$_2$-NDs/graphene substrate. For example, the R6G at 613 cm$^{-1}$ and 1648 cm$^{-1}$ peaks on the former has an enhancement factor of 2.1, and the enhancement factor is around ~2.6 for the 1190 cm$^{-1}$ and 1312 cm$^{-1}$ peaks at the R6G concentration of $5 \times 10^{-5}$ M.

In order to probe the SERS sensitivity of the AuNPs/ WS$_2$-NDs/graphene vdW heterostructure substrates, Raman spectra of R6G molecules of different concentrations as low as $10^{-12}$ M were collected using the 532 nm resonance excitation wavelength for R6G (data not shown). All Raman signatures of R6G are visible at higher R6G concentrations above $5 \times 10^{-12}$ M. With further reduction of the R6G concentration, the detectable signature modes of R6G are limited to the vibrational modes with larger polarizability, such as 613 cm$^{-1}$, 773 cm$^{-1}$, and 1191 cm$^{-1}$. In fact, the 613 cm$^{-1}$ peak remains visible at the lowest R6G concentration of $1 \times 10^{-12}$ M. This sensitivity appears to be one order of magnitude better than the best resonance R6G sensitivity so far reported using the plasmonic metal nanostructure/graphene substrates, and about two to four orders of magnitude better than that on the TMDs/metal nanostructure SERS substrates, and is more than an order of magnitude higher than that on the WS$_2$-NDs/graphene heterostructures. (See Xu, S. et al., *Sensors and Actuators B: Chemical* 2016, 222, 1175-1183; Chen, P. X. et al., *Applied Surface Science* 2016, 375, 207-214; Shorie, M. et al., *Mikrochim Acta* 2018, 185 (3), 158; Alamri, M. et al., *ACS Applied Nano Materials* 2019, 2 (3), 1412-1420; and Example 1, above.) In addition, this sensitivity is more than two orders of magnitude higher than the SERS sensitivity on Plasmonic AuNPs on 2D (continuous layer) MoS$_2$/graphene vdW heterostructures due to the additional LSPR of the nanodomes of TMDs on graphene. (Alamri, M. et al., 2019.) In other words, the further enhanced R6G SERS sensitivity can be attributed to the superposition of the LSPR effects from AuNPs and WS$_2$-NDs in the AuNPs/WS$_2$-NDs/graphene heterostructures.

R6G Raman peak intensities at 613 cm$^{-1}$ and 773 cm$^{-1}$, respectively, as a function of the R6G concentration on AuNPs/WS$_2$-NDs/graphene vdW heterostructures were plotted (not shown). The plots show a logarithmic relation between the Raman peak intensity and R6G concentration. However, the data points at high concentration did not fit the trends as well as the data points at lower concentrations, consistent with the results described in Example 1, above.

Since SERS sensitivity is primarily determined by the EM effect, it is important to understand the mechanism of the superposition of the evanescent electromagnetic fields by the AuNPs and WS$_2$-NDs. Depending on the shapes and sizes of metallic NPs and their composition, plasmonic EM enhancement can, in general, increase the effective intensity of the incident light and shorten radiative decay lifetimes of molecules (Purcell effect). The plasmonic properties of the WS$_2$-NDs studied here are partially associated with their optical doping. As a result, a primary impact of Au NPs may be an enhancement of excitation rates of the WS$_2$-NDs via plasmonic effects, i.e., $I_{eff}=P_{enh}I_0$ wherein $P_{enh}$ refers to the plasmon field enhancement factor, defined as the ratio of the squares of the field in the presence of AuNPs to that when the AuNP is absent, and $I_0$ represents the incident light intensity.

To further understand the impact of the Au NPs, numerical simulations were conducted. Specifically, the interaction of light with a hemispherical Au NP having a diameter of 40 nm was simulated. The Au NP was placed on a layered structure consisting of a SiO$_2$ substrate covered with 5 nm of a high refractive index dielectric material. The simulation was done using the Lumerical Finite-Difference Time-Domain (FDTD) solutions software, considering a plane wave reaching the Au NP from the top along the z-axis. For the 5-nm dielectric material, Ge from the library of this software was used. This is because for the range of wavelengths considered here, i.e., ~550 nm, Ge is similar to WS$_2$. Although Ge and WS$_2$ have different absorptions, since the thickness of the dielectric was very small, no significant change to the wavelengths of the plasmonic modes and their near fields are expected.

The simulated extinction spectrum (not shown) suggests that the Au NP supports formation of a sharp peak at about 568 nm. Interestingly, another peak at about 440 nm is also visible. The mode profile of the AuNP at the wavelength of 568 nm (not shown), indicates a significant field enhancement factor ($P_{enh}$) inside the 5-nm TMD layer. In fact, in the upper side of this layer $P_{enh}$ is close to 15 and in the lower side $P_{enh}$ reduces to about 4. Note that the wavelength of this mode (568 nm), is close to the maximum peak responsivity of the photodetectors based on application of WS$_2$-NDs on graphene described in Example 2, above. This suggests the possibility of coupling of the plasmon modes of the WS$_2$-NDs with those of the AuNPs, forming heterogeneous plasmonic dimmers. Such dimmers can offer more favorable field plasmon modes, particularly inside the 5-nm thick dielectric layer, leading to ultrahigh SERS sensitivities.

The mode profile at 532 nm wavelength (corresponding to the laser used to excite the samples) was also analyzed (not shown). While the $P_{enh}$ is smaller than that at the peak wavelength of the extinction spectrum, a considerable enhancement is achieved. Specifically, the field enhancement factors $P_{enh}$ at the upper edge, middle and lower edge of the 5-nm thick TMD layer are respectively 10, 3 and 2. This suggests the laser intensity on the WS$_2$-NDs can be significantly enhanced by the plasmonic effects of the AuNPs.

CONCLUSIONS

In summary, this Example reports a new SERS substrate based plasmonic AuNPs/WS$_2$-NDs/graphene vdW heterostructures. This substrate integrates two plasmonic nanostructures, AuNPs and WS$_2$-NDs. Their interface with graphene plays a critical role enabling superposition of their LSPR effects. This leads to further enhanced SERS sensitivity of R6G on the AuNPs/WS$_2$-NDs/graphene heterostructures. Using the R6G probe molecules, a high SERS sensitivity of $1 \times 10^{-12}$ M was achieved on AuNPs/WS$_2$NDs/ graphene substrates. Furthermore, this sensitivity is two to four orders of magnitude better than the R6G sensitivity on the TMDs/metal nanostructure SERS substrates. The DFT simulation suggests that the SERS enhancement may be attributed to the enhanced dipole-dipole interaction and charge transfer across the AuNP/WS$_2$-NDs/graphene vdW interfaces.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the disclosure has been presented for purposes of illustration and of description. It is not intended to be exhaustive or to limit the disclosure to the precise form disclosed, and modifications and variations are possible in light of the above teachings or may be acquired from practice of the disclosure. The embodiments were chosen and described in order to explain the principles of the disclosure and as practical applications of the disclosure to enable one skilled in the art to utilize the disclosure in various embodiments and with various modifications as suited to the particular use contemplated. It is intended that the scope of the disclosure be defined by the claims appended hereto and their equivalents.

What is claimed is:

1. A plasmonic substrate comprising a layer of graphene and a plurality of discrete, individual transition metal chalcogenide nanodomes distributed on a surface of the layer of graphene, each nanodome surrounded by bare graphene, wherein each nanodome does not comprise metal nanoparticles on its surface and the surface of the layer of graphene does not comprise metal nanoparticles, and further wherein the transition metal chalcogenide nanodomes are $WS_2$ nanodomes.

2. The substrate of claim 1, wherein at least 90% of the nanodomes on the layer of graphene are discrete, individual nanodomes surrounded by bare graphene.

3. The substrate of claim 1, wherein the plurality of transition metal chalcogenide nanodomes have an average thickness consistent with no more than 10 layers of the transition metal chalcogenide from which the plurality of transition metal chalcogenide nanodomes is formed.

4. The substrate of claim 3, wherein the average thickness is less than 10 nm.

5. The substrate of claim 3, wherein the plurality of transition metal chalcogenide nanodomes have an average diameter in a range of from 50 nm to 500 nm.

6. The substrate of claim 3, wherein the plurality of transition metal chalcogenide nanodomes have an average nanodome-to-nanodome spacing in a range of from 1 nm to 300 nm.

7. The substrate of claim 3, wherein the plurality of transition metal chalcogenide nanodomes have an average diameter in a range of from 50 nm to 500 nm and an average nanodome-to-nanodome spacing in a range of from 1 nm to 300 nm.

8. The substrate of claim 7, wherein the average thickness is less than 10 nm.

9. An optoelectronic device comprising the substrate of claim 1, an electrode in electrical communication with the substrate, and a counter electrode in electrical communication with the substrate and the electrode.

10. A method of forming the substrate of claim 1, the method comprising applying a solution comprising a transition metal precursor to the surface of the layer of graphene to form a coating thereon, and annealing the coating in the presence of a chalcogen to induce self-assembly of the nanodomes.

11. The method of claim 10, wherein the coating has a thickness of no more than 10 nm.

12. The method of claim 10, wherein applying the solution is carried out by dip coating the layer of graphene into the solution followed by spinning to form the coating.

13. The method of claim 12, wherein no more than two dips are used.

14. A method of using the substrate of claim 1, the method comprising illuminating the substrate with electromagnetic radiation to excite surface plasmons at the nanodome-graphene interfaces.

* * * * *